(12) United States Patent
Peng et al.

(10) Patent No.: US 9,716,146 B2
(45) Date of Patent: Jul. 25, 2017

(54) INTEGRATED CIRCUIT STRUCTURE AND METHOD WITH SOLID PHASE DIFFUSION

(71) Applicant: Taiwan Semiconductor Manufacturing Company, Ltd., Hsin-Chu (TW)

(72) Inventors: Cheng-Yi Peng, Taipei (TW); Ling-Yen Yeh, Hsinchu (TW); Chi-Wen Liu, Hsinchu (TW); Chih-Sheng Chang, Hsinchu (TW); Yee-Chia Yeo, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/969,077

(22) Filed: Dec. 15, 2015

(65) Prior Publication Data

US 2017/0170278 A1    Jun. 15, 2017

(51) Int. Cl.
| | |
|---|---|
| *H01L 21/82* | (2006.01) |
| *H01L 29/10* | (2006.01) |
| *H01L 27/088* | (2006.01) |
| *H01L 29/06* | (2006.01) |
| *H01L 21/8234* | (2006.01) |

(52) U.S. Cl.
CPC .. *H01L 29/1083* (2013.01); *H01L 21/823412* (2013.01); *H01L 21/823431* (2013.01); *H01L 21/823468* (2013.01); *H01L 21/823481* (2013.01); *H01L 27/0886* (2013.01); *H01L 29/0649* (2013.01)

(58) Field of Classification Search
CPC .................................................... H01L 29/1083
USPC .......................................................... 257/345
See application file for complete search history.

(56) References Cited

U.S. PATENT DOCUMENTS

| | | | |
|---|---|---|---|
| 7,425,740 | B2 | 9/2008 | Liu et al. |
| 8,048,723 | B2 | 11/2011 | Chang et al. |
| 8,053,299 | B2 | 11/2011 | Xu |
| 8,183,627 | B2 | 5/2012 | Currie |
| 8,415,718 | B2 | 4/2013 | Xu |
| 8,497,177 | B1 | 7/2013 | Chang et al. |
| 8,609,518 | B2 | 12/2013 | Wann et al. |
| 8,618,556 | B2 | 12/2013 | Wu et al. |
| 8,633,516 | B1 | 1/2014 | Wu et al. |
| 8,703,565 | B2 | 4/2014 | Chang et al. |
| 8,742,509 | B2 | 6/2014 | Lee et al. |
| 8,776,734 | B1 | 7/2014 | Roy et al. |
| 8,785,285 | B2 | 7/2014 | Tsai et al. |
| 8,796,666 | B1 | 8/2014 | Huang et al. |

(Continued)

*Primary Examiner* — Kenneth Parker
*Assistant Examiner* — Warren H Kilpatrick
(74) *Attorney, Agent, or Firm* — Haynes and Boone, LLP

(57) ABSTRACT

The present disclosure provides a semiconductor structure. The semiconductor structure includes a fin active region formed on a semiconductor substrate and spanning between a first sidewall of a first shallow trench isolation (STI) feature and a second sidewall of a second STI feature; an anti-punch through (APT) feature of a first type conductivity; and a channel material layer of the first type conductivity, disposed on the APT feature and having a second doping concentration less than the first doping concentration. The APT feature is formed on the fin active region, spans between the first sidewall and the second sidewall, and has a first doping concentration.

20 Claims, 19 Drawing Sheets

(56) References Cited

U.S. PATENT DOCUMENTS

| | | |
|---|---|---|
| 8,815,712 B2 | 8/2014 | Wan et al. |
| 9,054,219 B1 * | 6/2015 | Hoffmann ....... H01L 21/823431 |
| 2013/0280883 A1 * | 10/2013 | Faul .................... H01L 21/2255 |
| | | 438/434 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |

* cited by examiner

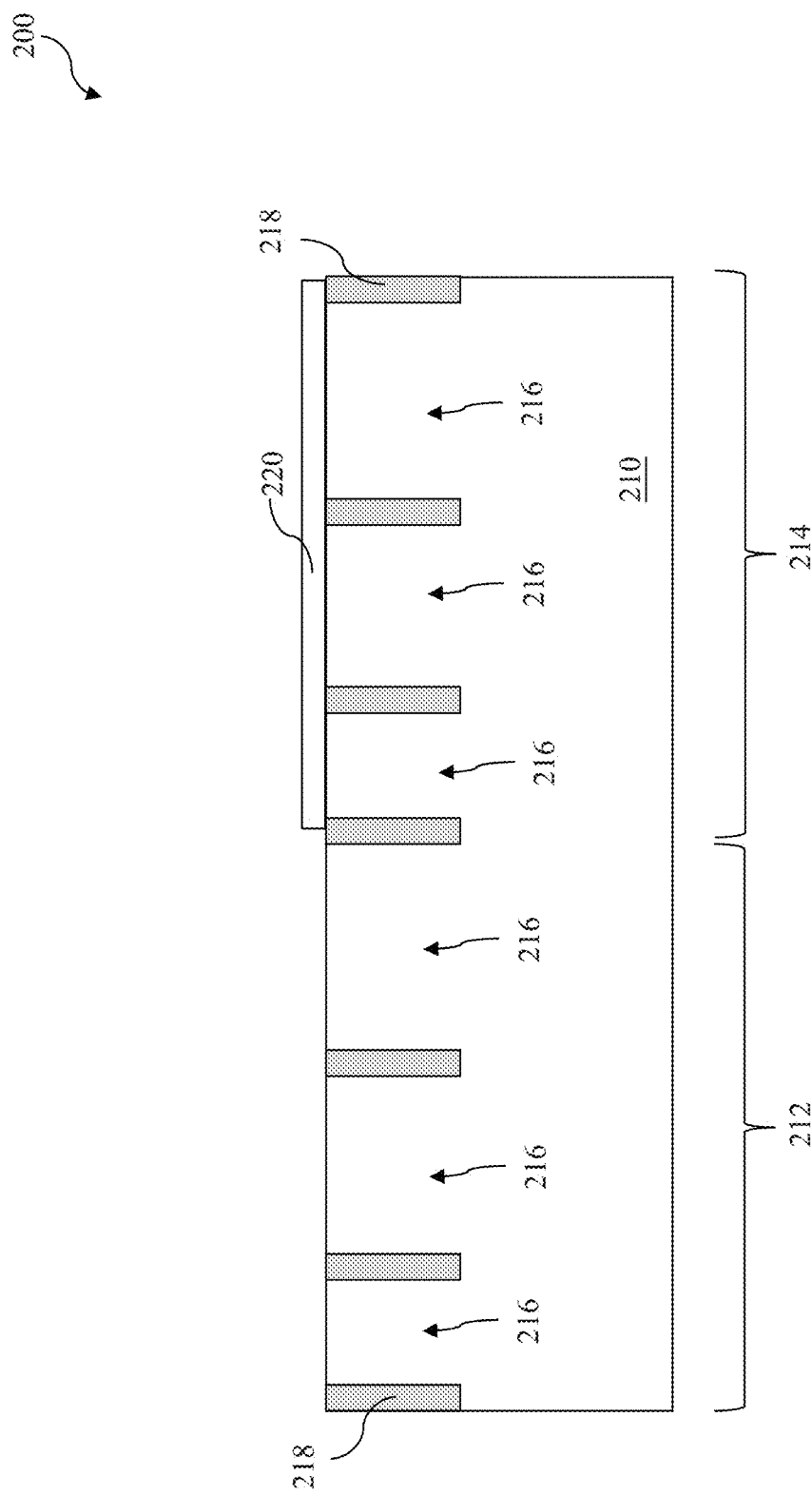

US 9,716,146 B2

INTEGRATED CIRCUIT STRUCTURE AND METHOD WITH SOLID PHASE DIFFUSION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized. Similar developments in IC processing and manufacturing are needed. For example, a three dimensional transistor, such as a fin-like field-effect transistor (FinFET), has been introduced to replace a planar transistor. Furthermore, extreme ultraviolet lithography is also introduced for forming IC patterns. Although existing FinFET devices and methods of fabricating FinFET devices have been generally adequate for their intended purposes, they have not been entirely satisfactory in all respects. For example, anti-punch-through implantation cannot be properly implemented due to shadow effect, degradation of the mobility due to dopant residual in the channel region, and other concerns. For example, defects are introduced to the interface between the channel and shallow trench isolation features, and cause the leakage current, especially for the high mobility channel. Therefore, what is needed is the structure for integrated circuit structure and the method making the same to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, 6, 7, 8, 9, 10, 11, 12, 13, 14, 15, 16 and 17 are sectional views of the semiconductor structure at various fabrication stages, constructed in accordance with some embodiments.

DETAILED DESCRIPTION

Figure 1:
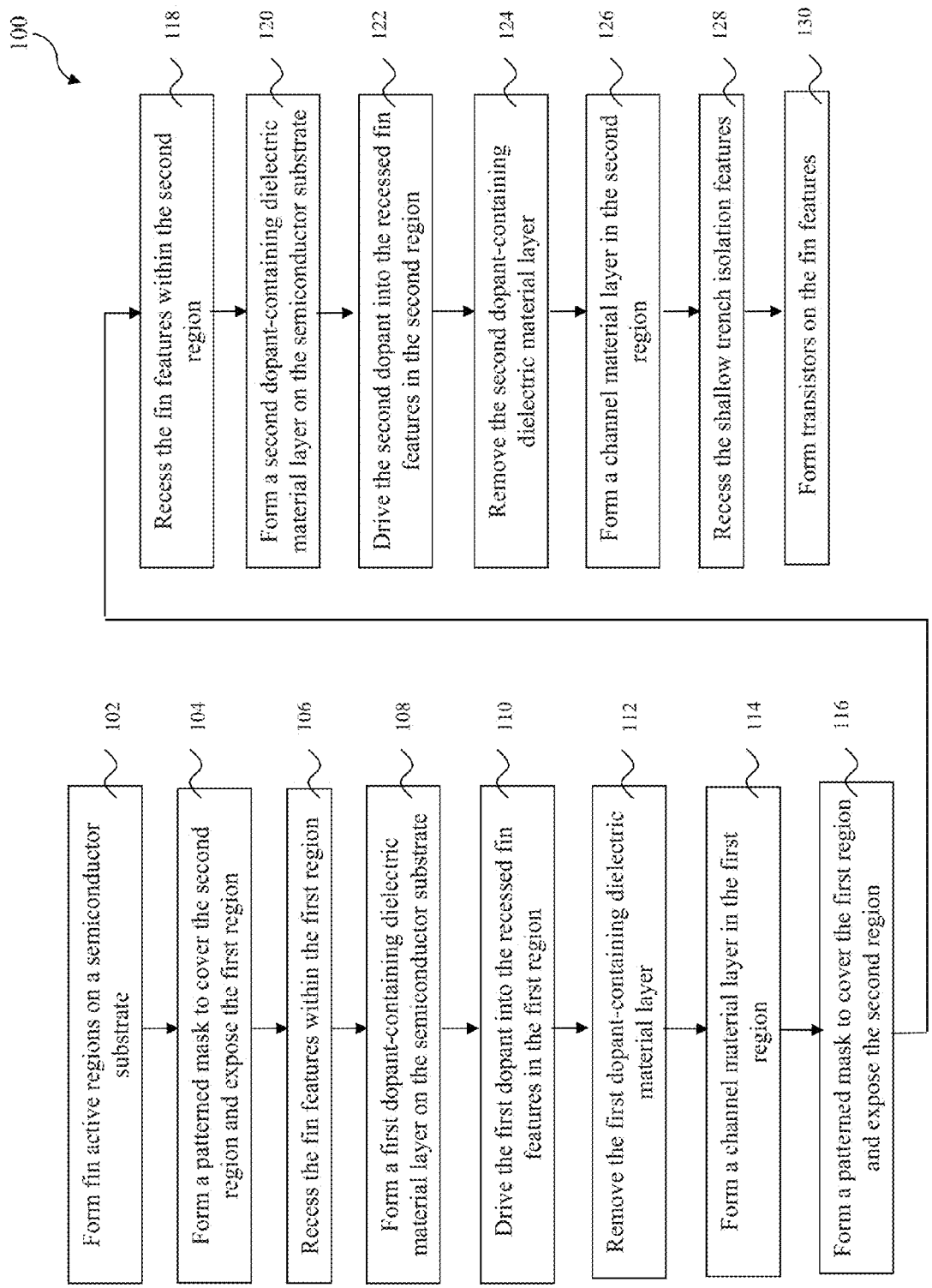
FIG. 1 is a flowchart of an integrated circuit fabrication method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 2:
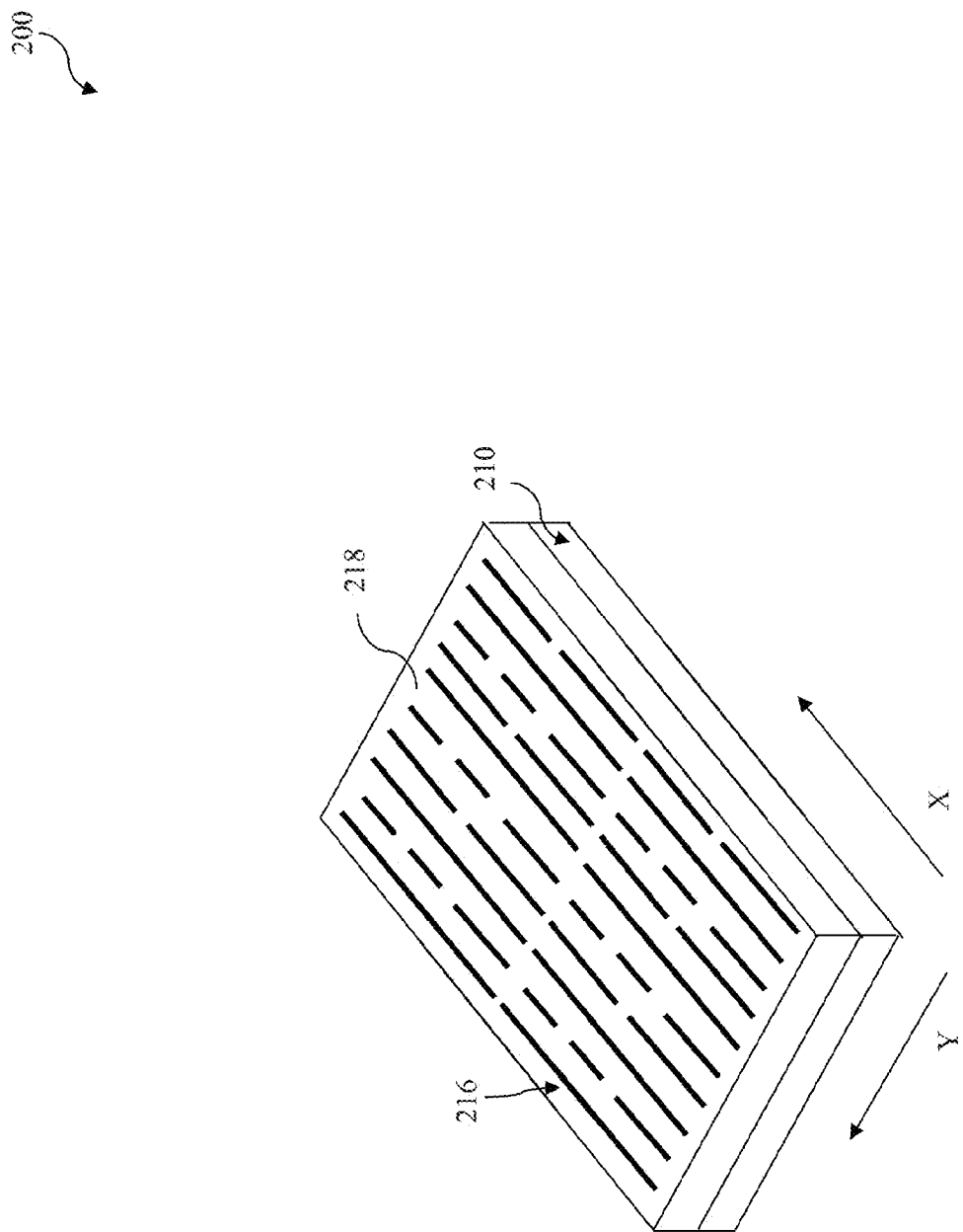
FIG. 2 is a perspective view of a semiconductor structure, constructed in accordance with some embodiments.
Figure 3A:
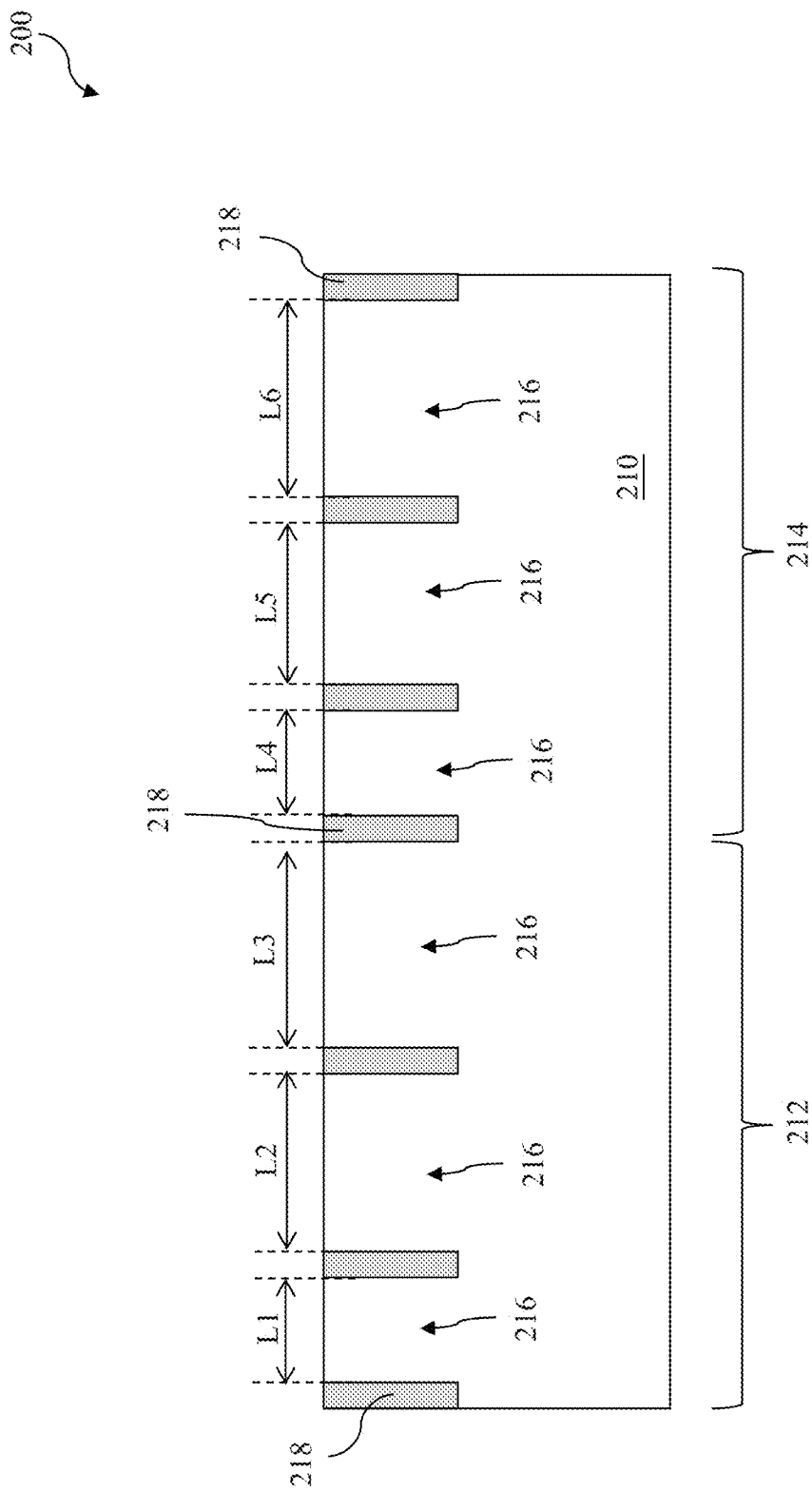
FIGS. 3A and 3B are sectional views of the semiconductor structure of FIG. 2, along x and y directions, respectively, in accordance with some embodiments.
Figure 3B:
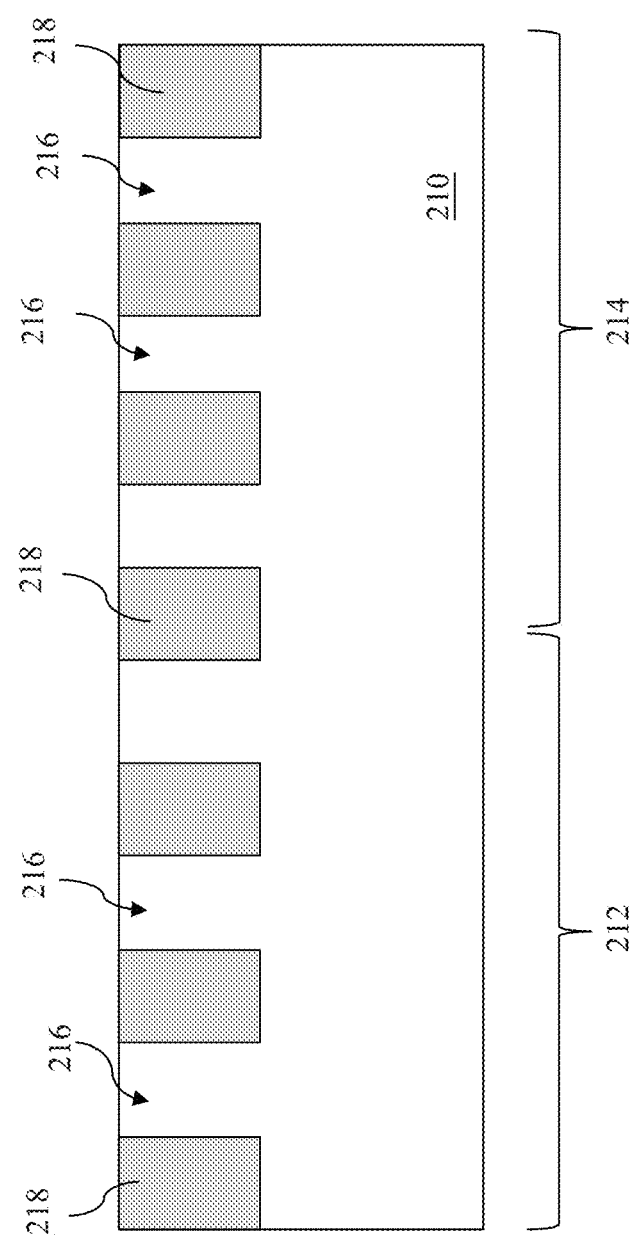

FIG. 1 is a flowchart of a method 100 for fabricating a semiconductor structure (particularly including a FinFET structure having one or more FinFET devices) 200, constructed in accordance with some embodiments. In accordance with some embodiments, FIG. 2 is a perspective view of the semiconductor structure 200; FIGS. 3A and 3B are sectional views of the semiconductor structure 200 along x and y directions, respectively; FIGS. 4 through 17 are sectional views of the semiconductor structure 200 at various fabrication stages; and FIG. 18 is a sectional view of the semiconductor structure 200 of FIG. 17 in portion. It is understood that additional steps may be implemented before, during, and after the method, and some of the steps described may be replaced or eliminated for other embodiments of the method. The semiconductor structure 200 and the method 100 making the same are collectively described with reference to various figures.

Referring to FIGS. 1, 2, 3A and 3B, the method 100 begins at 102 by providing a semiconductor structure 200 having a substrate 210 and forming fin active regions 216 on the semiconductor substrate 210. The substrate 210 includes a first region for NMOS (also referred to as a NMOS region) 212 and a second region for PMOS (also referred to as a PMOS region) 214. In the present embodiment, the substrate 210 is a bulk silicon substrate. In furtherance of the present embodiment, the substrate 210 is a silicon wafer. In some embodiments, the substrate 210 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon wafer.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods. The substrate 210 may include various doped features depending on design requirements as known in the art. The doped features may be doped with p-type dopants, such as boron; n-type dopants, such as phosphorus or arsenic; or combinations thereof. The doped features may be formed by ion implantations.

One or more fin active regions (fins) 216 are formed on the substrate 210. The fins 216 include a semiconductor material, as active regions. In some embodiments, the fins 216 include silicon and are extended from the substrate 210 as a part of the substrate 210. In some other embodiments, the fins 216 additionally or alternatively include other semiconductor material, such as silicon germanium and/or silicon carbide, formed by a suitable technique, such as epitaxy growth. The fin active regions 216 may have various semiconductor materials and different structure for enhanced device performance, such as high mobility channel. In some examples, the fin active regions 216 may include silicon, silicon germanium, strained silicon on insulator (SSOI), germanium on insulator (GOI), or a combination thereof.

The semiconductor structure 200 also includes various isolation features 218 disposed on the substrate 210 and horizontally surround the fin features 216. In the present embodiments, the isolation features 218 are shallow trench isolation (STI) features 218 and include one or more dielectric materials, such as silicon oxide, low-k dielectric material, air gap, other suitable dielectric materials, or a combination thereof.

In some embodiments, the fins 216 are formed by any suitable procedure including deposition, photolithography, and/or etching processes. In one embodiment, the fins 216 and the DTI features 218 are collectively formed by a procedure that includes patterning the substrate 210 to form trenches, filling the trenches with one or more dielectric material, and polishing the substrate 210 to remove excessive dielectric material and planarize the top surface. In furtherance of the embodiment, the patterning the substrate 210 may include forming a hard mask and applying an etch process to the substrate 210 through the openings of the hard mask to form trenches in the substrate 210. The hard mask may be formed by a procedure that includes depositing a hard mask material layer and etching the hard mask material layer. In some examples, the hard mask material layer includes a silicon oxide and a silicon nitride subsequently deposited on the substrate 210. The hard mask layer 212 may be formed by thermal oxidation, chemical vapor deposition (CVD), atomic layer deposition (ALD), or any other appropriate method. The procedure to form the hard mask further includes forming a patterned photoresist (resist) layer by a lithography process, and etching the hard mask material layer through the openings of the patterned resist layer to transfer the openings to the hard mask material layer. An exemplary photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In some other embodiments, the patterned resist layer may be directly used as an etch mask for the etch process to form the trenches.

The fin active regions 216 within the first region 212 may be referred to as n-type fin features because the semiconductor material therein is doped appropriately to form an n-type transistor. Specifically, the semiconductor material is doped with a p-type dopant such as boron. Similarly, the fin active regions 216 within the second region 214 may be referred to as p-type fin features because they will ultimately be doped appropriately to form a p-type transistor. Specifically, they will be doped with an n-type dopant such as phosphorous.

The semiconductor structure 200 includes various devices, such as logical devices and I/O devices. In various semiconductor devices, different transistors may have different sizes. According to an illustrated example, a first n-type fin feature 216 within the first region 212 has a first dimension L1 to form a short channel transistor (e.g., a high performance logic transistor); a second n-type fin feature 216 within the first region 212 has a second dimension L2 to form a middle channel transistor (e.g., a standby transistor); and a third n-type fin feature 216 within the first region 212 has a third dimension L3 to form a long channel transistor (e.g., a I/O transistor). Those dimensions are different: L1<L2 and L2<L3. Similarly according to an illustrated example, a first p-type fin feature 216 within the second region 214 has a fourth dimension L4 to form a short channel transistor; a second p-type feature 216 within the second region 214 has a fifth dimension L5 to form a middle channel transistor; and a third p-type feature 216 within the second region 214 has a sixth dimension L6 to form a long channel transistor. Those dimensions are different: L4<L5 and L5<L6. However, the semiconductor structure 200 may include transistors with more or less sizes.

Referring to FIGS. 1 and 4, the method 100 includes an operation 104 to form a first patterned mask 220. The pattern mask 220 covers the second region 214 and has the openings to expose the first region 212. In some embodiments, the patterned mask 220 is a hard mask and includes a dielectric material, such as silicon oxide, silicon nitride, silicon oxynitride, other suitable dielectric material or a combination thereof. For example, the hard mask may include more than one material layer, such as a silicon oxide film and a silicon nitride film on the silicon oxide film. In some examples, the formation of the hard mask includes depositing a hard mask material layer; forming a patterned resist layer on the hard mask material layer by lithography; and transferring the pattern from the patterned resist layer to the hard mask material layer by etching; and removing the patterned resist layer by wet stripping or plasma ashing. Alternatively, the patterned mask 220 may be a patterned resist layer formed by lithography.

Figure 5:
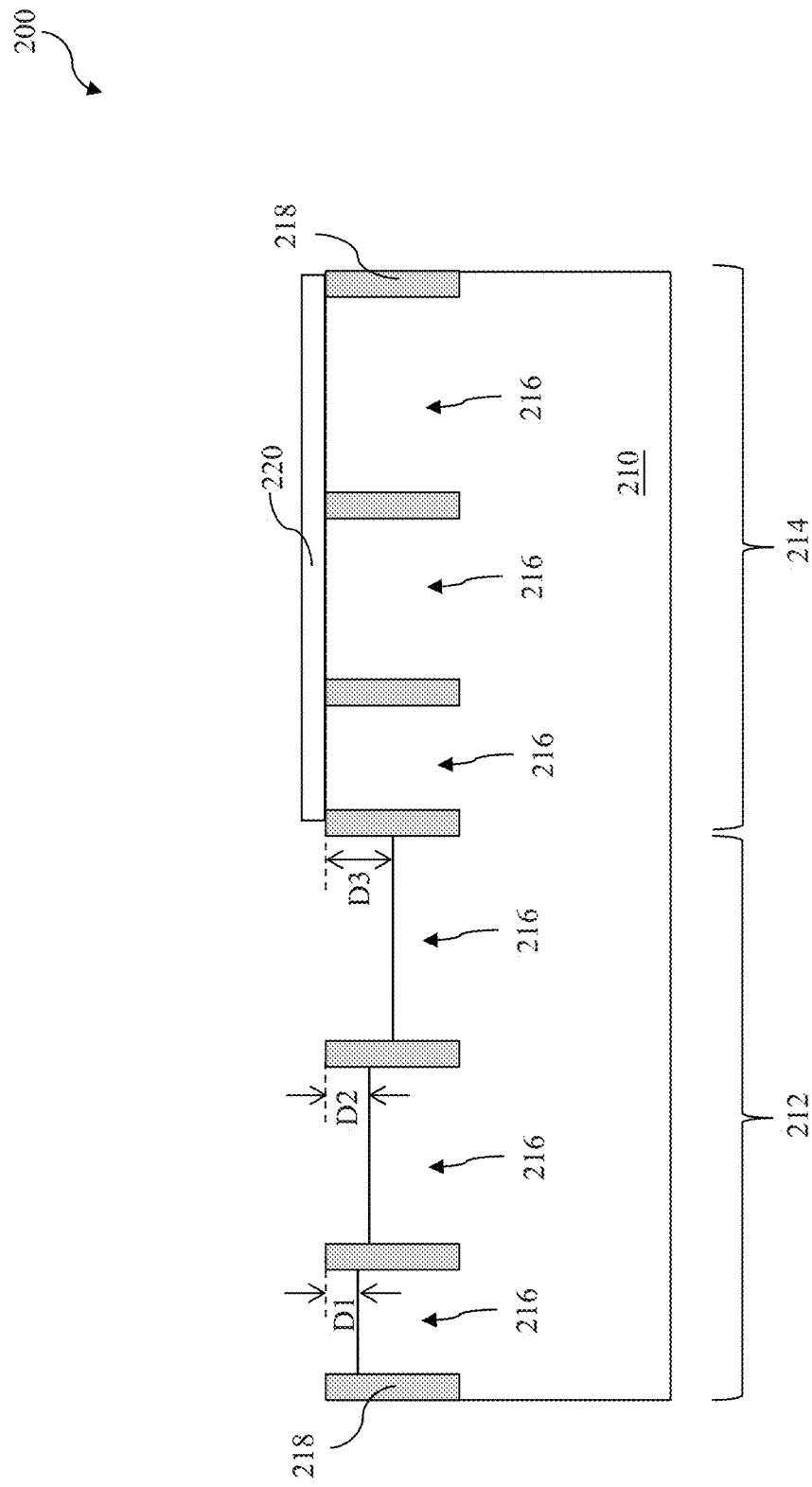

Referring to FIGS. 1 and 5, the method 100 includes an operation 106 to recess the fin features 216 within the first region 212 by etching. The etching process is designed to selectively remove the semiconductor material(s) in the fin active regions 216 while the STI features remain. The etching process may include dry etch, wet etch or a combination. The patterned mask 220 protects the fin features 216 within the second region 214 form etching. Because of the loading effect of the etching process, the fin features 216 that are larger will be etched more quickly than the smaller fin features 216. Specifically, because the three n-type fin features 216 have dimensions L1, L2 and L3, respectively, the corresponding recessed depths (D1, D2, and D3) are different. Particularly, D1 is less than D2 and D2 is less than D3. Thus, at later stage, anti-punch-through (APT) doping features are formed in the respective n-type fin features at different levels. The etching process is designed with a suitable etch duration and an etch rate such that the depths (D1, D2 and D3) are within the desired ranges.

Figure 6:
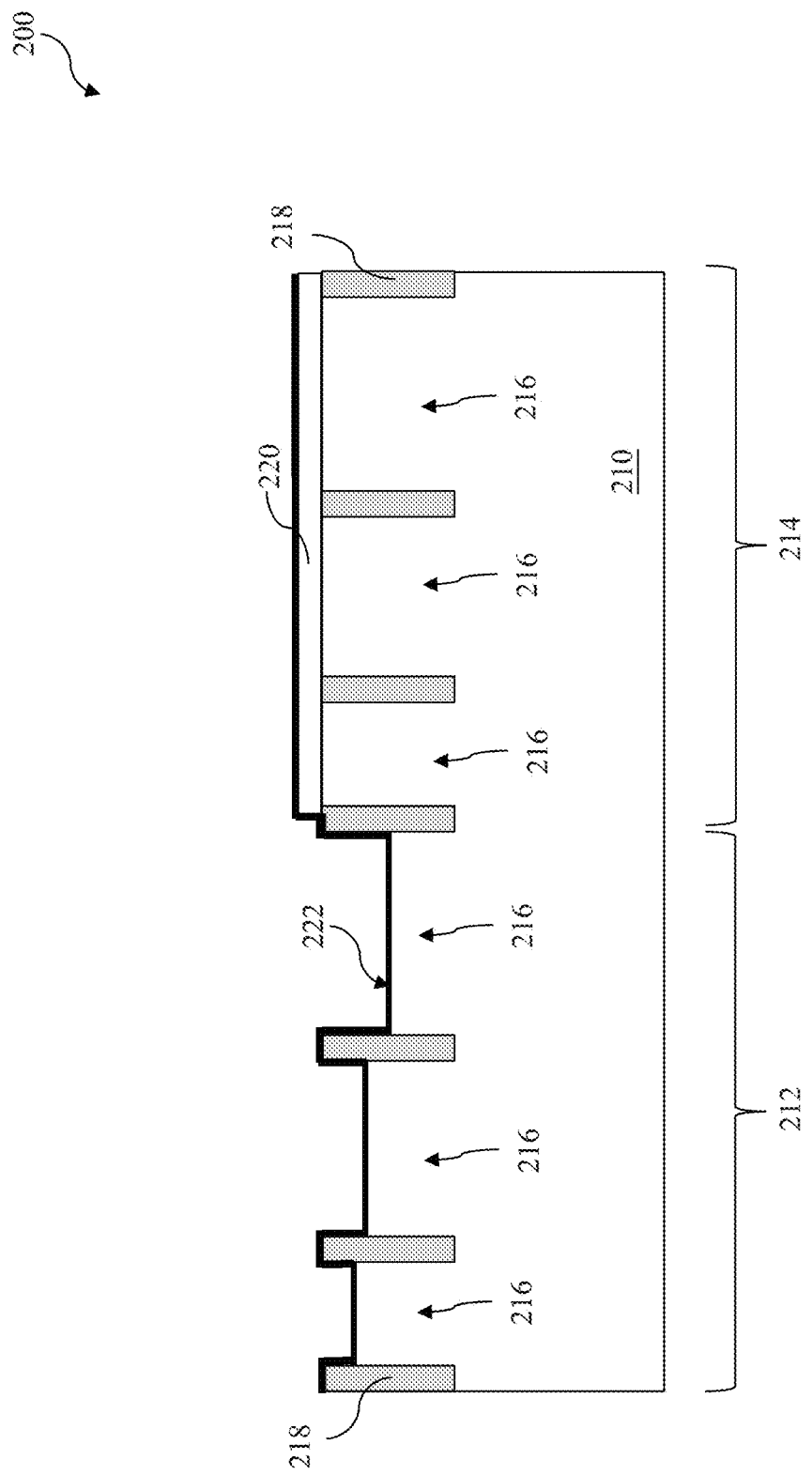

Referring to FIGS. 1 and 6, the method 100 proceeds to operation 108 by forming a first dopant-containing dielectric material layer 222 having a first-type dopant. Particularly, the first dopant-containing dielectric material layer 222 is formed in the recessed fin features and the sidewalls of the STI features 218 within the first region 212. In the present embodiment, the first type dopant is a p-type dopant. In some embodiments, the operation 106 includes depositing a borosilicate glass (boron-doped-glass or BSG) layer 228 containing p-type dopant. The BSG layer 222 functions as a solid source for the p-type dopant to be introduced to the n-type fin features 216 within the first region 212. The concentration of the p-type dopant in the BSG layer 222 is designed such that to introduce the p-type dopant with a proper doping concentration during one or more subsequent thermal process. In some embodiments, the dopant concentration of the BSG layer 222 ranges from about $10^{21}/cm^3$ to about $8 \times 10^{21}/cm^3$. The BSG layer 222 is formed by a suitable technique, such as CVD with suitable precursor. In some examples, the precursor to form the BSG layer 222 by CVD includes $SiH_4$, $O_2$, and $B_2H_6$.

In some embodiments, the operation 108 further includes depositing an un-doped silicate glass (USG) layer on the BSG layer. In this case, the USG layer and the BSG layer are collectively referred to by the numeral 222. The USG layer is a capping layer to protect the BSG layer. Various material layers may be formed by suitable technology, such as CVD. In some examples, the BSG layer has a thickness ranging between 0.5 nm and 2 nm; and the USG layer has a thickness ranging between of 1 nm and 4 nm.

Figure 7:
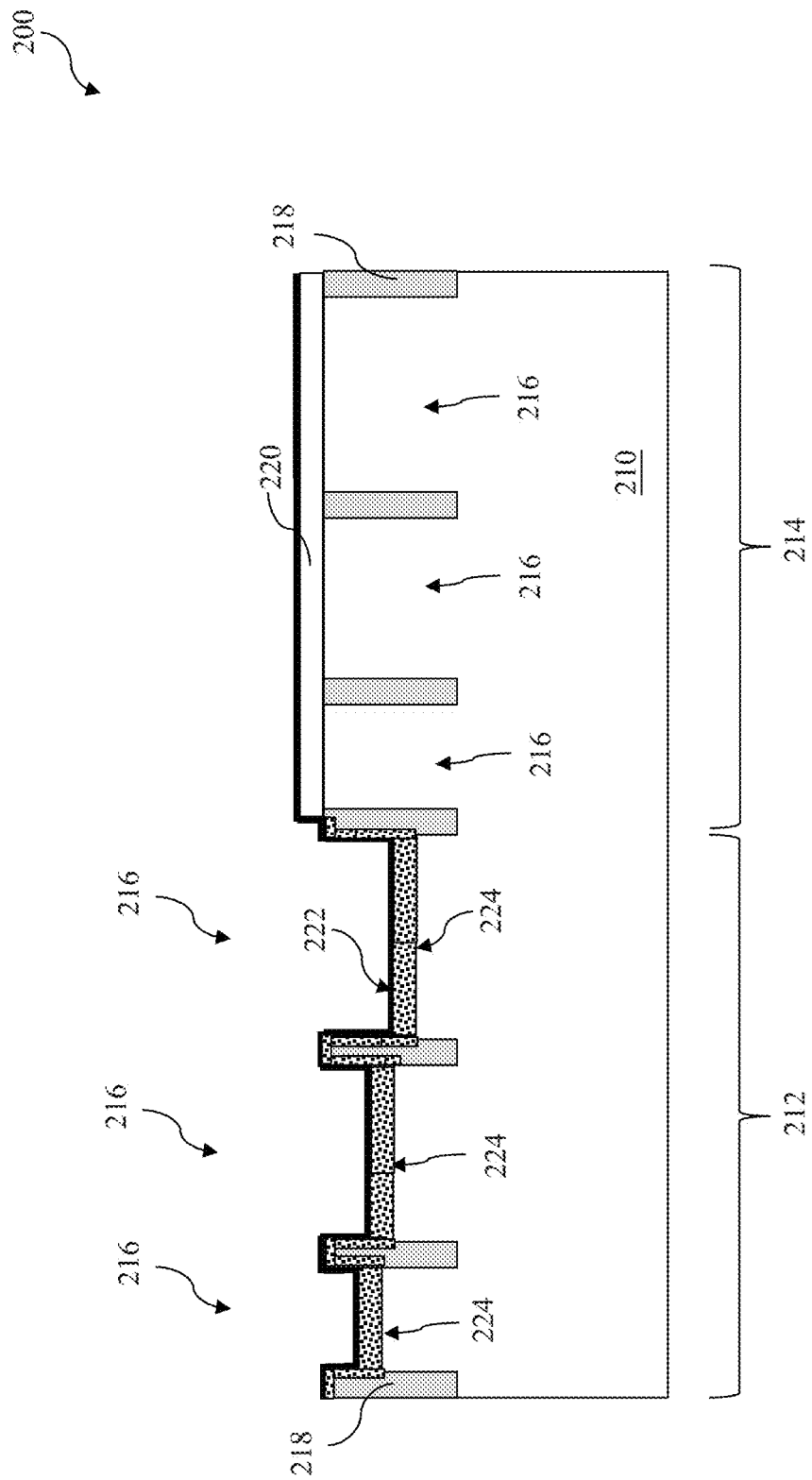

Referring to FIGS. 1 and 7, the method 100 proceeds to operation 110 to drive the dopant from the BSG layer to the recessed fin features (that are the n-type fin features 216 within the first region 212), thereby forming APT features 224 of p-type conductivity (also referred to as p-type APT features) in the recessed fin features. The operation 110 may include one or more thermal process to drive the dopant from the BSG layer to the recessed fin features. The thermal process is designed with proper annealing temperature and annealing duration. In some examples, the thermal annealing process may be implemented in a rapid thermal annealing apparatus. Thus formed p-type APT features 224 are positioned at different levels but with a same thickness, which is determined by the dopant concentration of the BSG layer and the thermal annealing process (including annealing temperature and annealing duration). In some examples, the p-type APT features 224 are formed to have a thickness within a range of about 5-10 nanometers. In one example, the concentration of the p-type dopant for the APT features 224 is within a range of about $1 \times 10^{17}/cm^3$-$1 \times 10^{18}/cm^3$. The dopant concentration of the APT features 224 is greater than that of the channel layer that is to be formed at a later stage, as described below. The p-type APT features 224 are not formed in the second region 214 since the hard mask 220 prevents the diffusion of the dopant from the BSG layer to the fin features in the second region 214.

Additionally, the dopant is also driven into the STI features 218, such as into surfaces of the STI features. The doped surfaces of the STI features extend from the fin features 216 to the top surfaces of the STI features within the first region 212, as illustrated in FIG. 7. The STI features with doped surfaces help enhance device performance, such as eliminating the leakage by junction isolation effect, and reducing faucet issue associated with epitaxy growth. The doped surfaces of the STI features 218 within the first region 212 are extended portions of the APT features 224 and will be discussed later.

Figure 8:
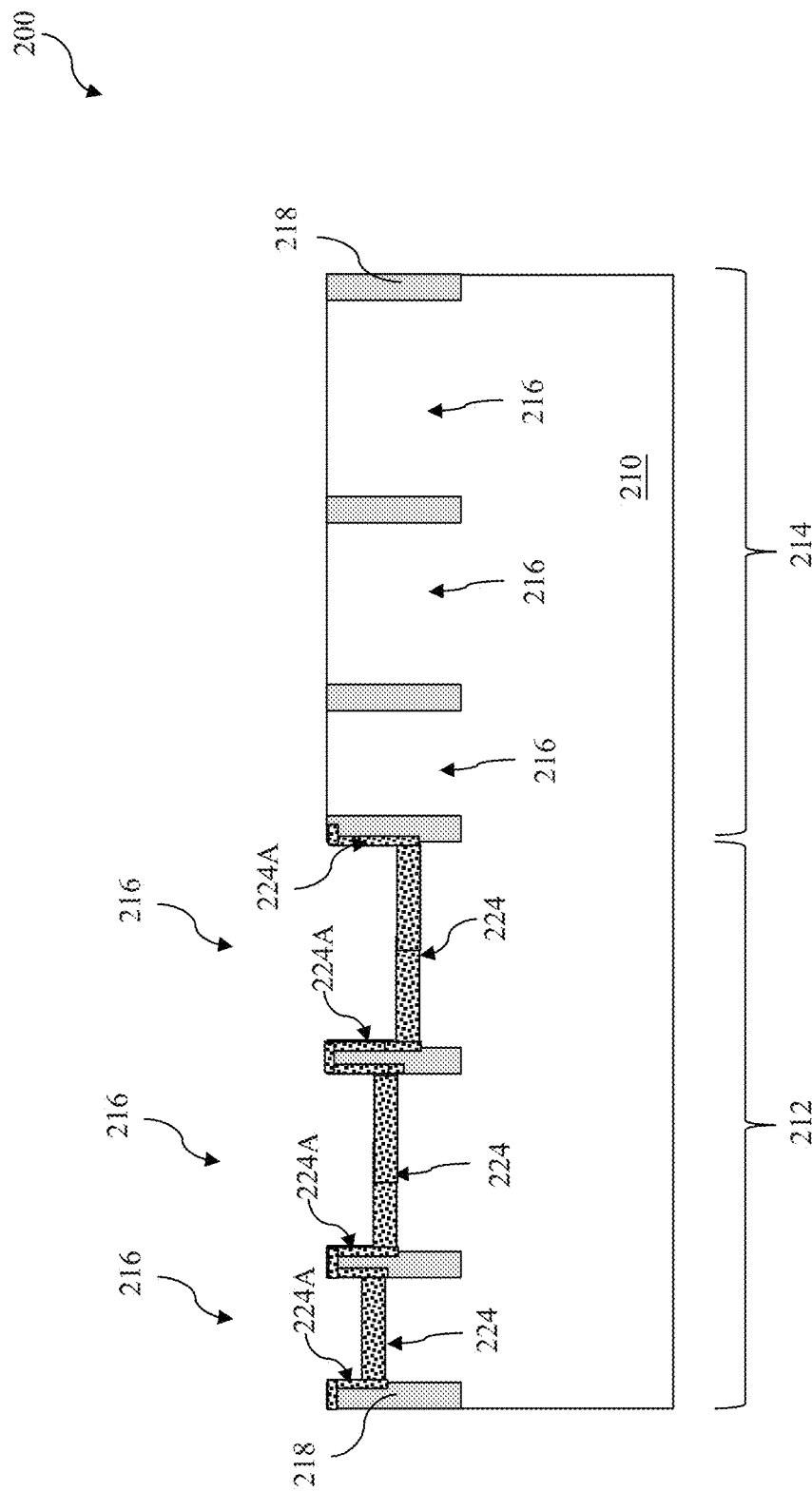

Referring to FIGS. 1 and 8, the method 100 proceeds to operation 112 to remove the first dopant-containing dielectric material layer 222, which is the BSG layer in the present embodiment. In some embodiments, the USG layer is removed as well when it is present. The removal of the first dopant-containing dielectric material layer is by a suitable etching process. For example, the BSG layer (and the USG layer) is removed by a wet etch using diluted hydrofluoric acid (DHF) solution. In the operation 112, the hard mask 220 is removed as well according to the present embodiment. For example, the hard mask 220 of silicon nitride may be removed by a wet etch using (hot) phosphorous acid.

Particularly, the doped surfaces, labeled as 224A in FIG. 8, of the STI features 218 within the first region 212 have different heights in different regions, such as short channel region and long channel region. The doped surfaces 224A are p-type doped.

Figure 9:
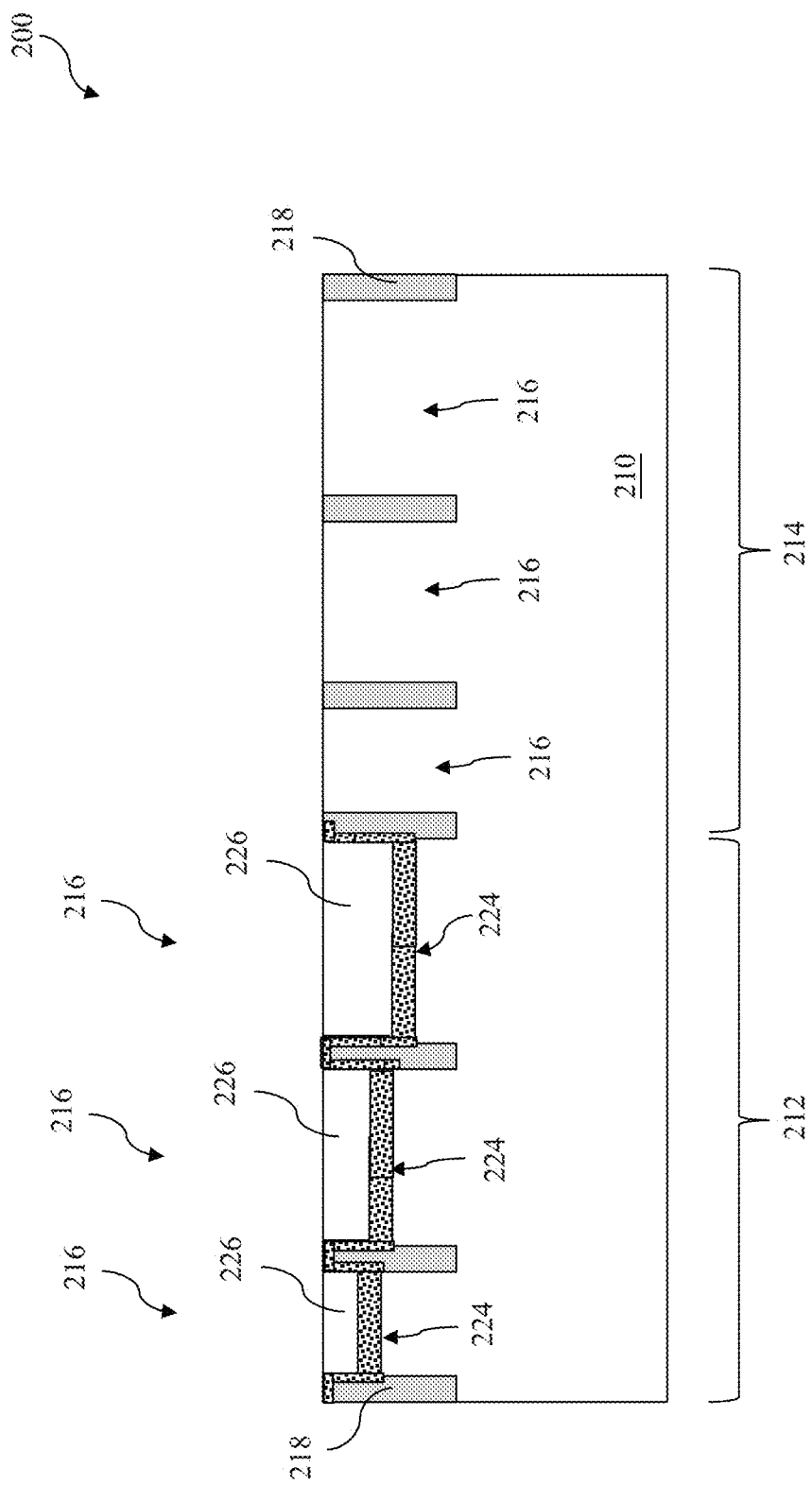

Referring to FIGS. 1 and 9, the method 100 proceeds to operation 114 to form channel material layer 226 in the trenches within the first region 212. The channel material layer 226 includes a semiconductor material epitaxially grown in the trenches and doped with p-type dopant, such as boron. Since the APT features 224 are at different levels and the channel material layer 226 has a planarized surface, the channel material layer 226 on the different fin features has different thicknesses, as illustrated in FIG. 9.

In some embodiments, the semiconductor material in the channel material layer 226 is different from that of the substrate 210 for various considerations, such as strain effect for high mobility or using a semiconductor material of high mobility. In various examples, the channel material layer 226 includes silicon, silicon germanium, germanium, silicon germanium tin (SiGeSn), germanium tin (GeSn), or a compound semiconductor material from III-V groups. In exemplary embodiments, the compound semiconductor material from III-V groups includes Gallium arsenide, Gallium arsenide phosphide, Gallium nitride, Gallium phosphide, Indium arsenide, Indium gallium arsenide, Indium gallium nitride, Indium gallium phosphide, Indium nitride, Indium phosphide, Aluminium arsenide, Aluminium gallium arsenide, Aluminium gallium indium phosphide, Aluminium gallium nitride, Aluminium gallium phosphide, Aluminium indium arsenide, Aluminium nitride, Aluminium phosphide, or a combination thereof. In further examples, the channel material layer 226 may include two or more semiconductor material films.

In some embodiments, the formation of the channel material layer 226 includes epitaxy growth, and chemical mechanical polishing (CMP). The channel material layer 226 is doped with the first type dopant (p-type dopant in the present example), same to that of the APT features 224 but with a different doping concentration. Particularly, the doping concentration of the channel material layer 226 is less than the doping concentration of the APT features 224. The dopant in the channel material layer 226 is designed for proper threshold voltage of the corresponding transistor and other consideration, such as leakage current. In various embodiments, the dopant is introduced to the channel material layer 226 by in-situ doping or ion implantation. For in-situ doping, the precursor of the epitaxy growth additionally includes a dopant-containing chemical. Therefore, the dopant is introduced to the channel material layer 226 during the epitaxy growth.

In the present embodiment, the faucet issue of the epitaxy growth is eliminated or reduced. Faucet issue refers to a gap is formed between the epitaxy feature and the STI feature during epitaxy growth due to the growth selectivity. By forming doped surfaces of the STI features 218 during the formation of the APT features 224 (through the operations 106-110), the surfaces of the STI features 218 is modified. The selectivity of the epitaxy growth is reduced so that the channel semiconductor material is also grown on the sidewalls of the STI features, thereby eliminating or reducing the faucet issue.

Figure 10:
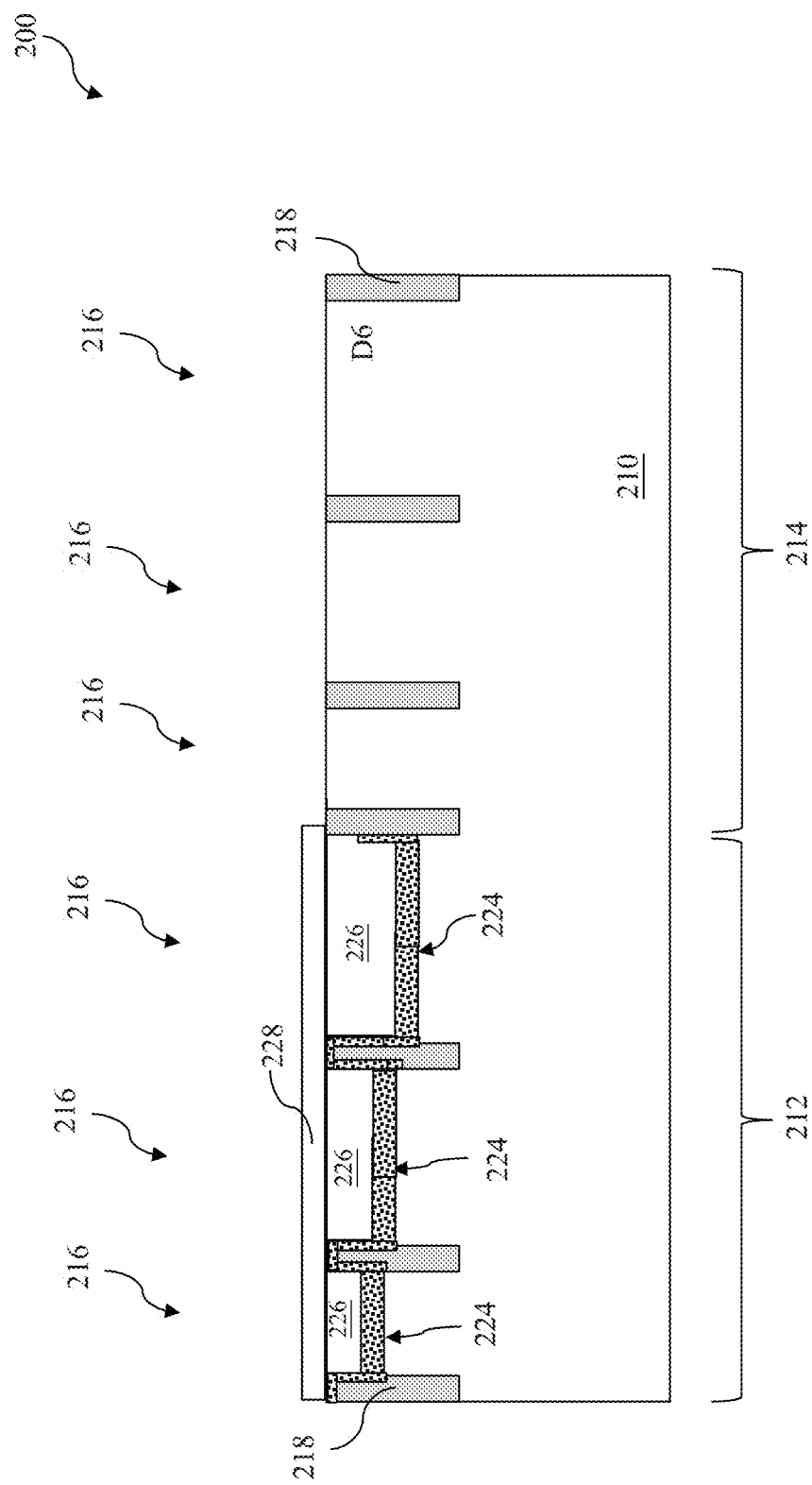

Referring to FIGS. 1 and 10, the method 100 proceeds to operation 116 to form a second patterned mask 228 on the substrate 210. The second hard mask covers the first region 212 and has one or more opening such that the second region 214 is exposed within the opening. In some embodiments, the patterned mask 228 is a hard mask and includes a dielectric material, such as silicon oxide, silicon nitride, silicon oxynitride, other suitable dielectric material or a combination thereof. The hard mask 228 may include more than one material layer, such as a silicon oxide film and a silicon nitride film on the silicon oxide film. In some examples, the formation of the hard mask includes depositing a hard mask material layer; forming a patterned resist layer on the hard mask material layer by lithography; and transferring the pattern from the patterned resist layer to the hard mask material layer by etching; and removing the patterned resist layer by wet stripping or plasma ashing. Alternatively, the patterned mask 228 may be a patterned resist layer formed by lithography.

Figure 11:
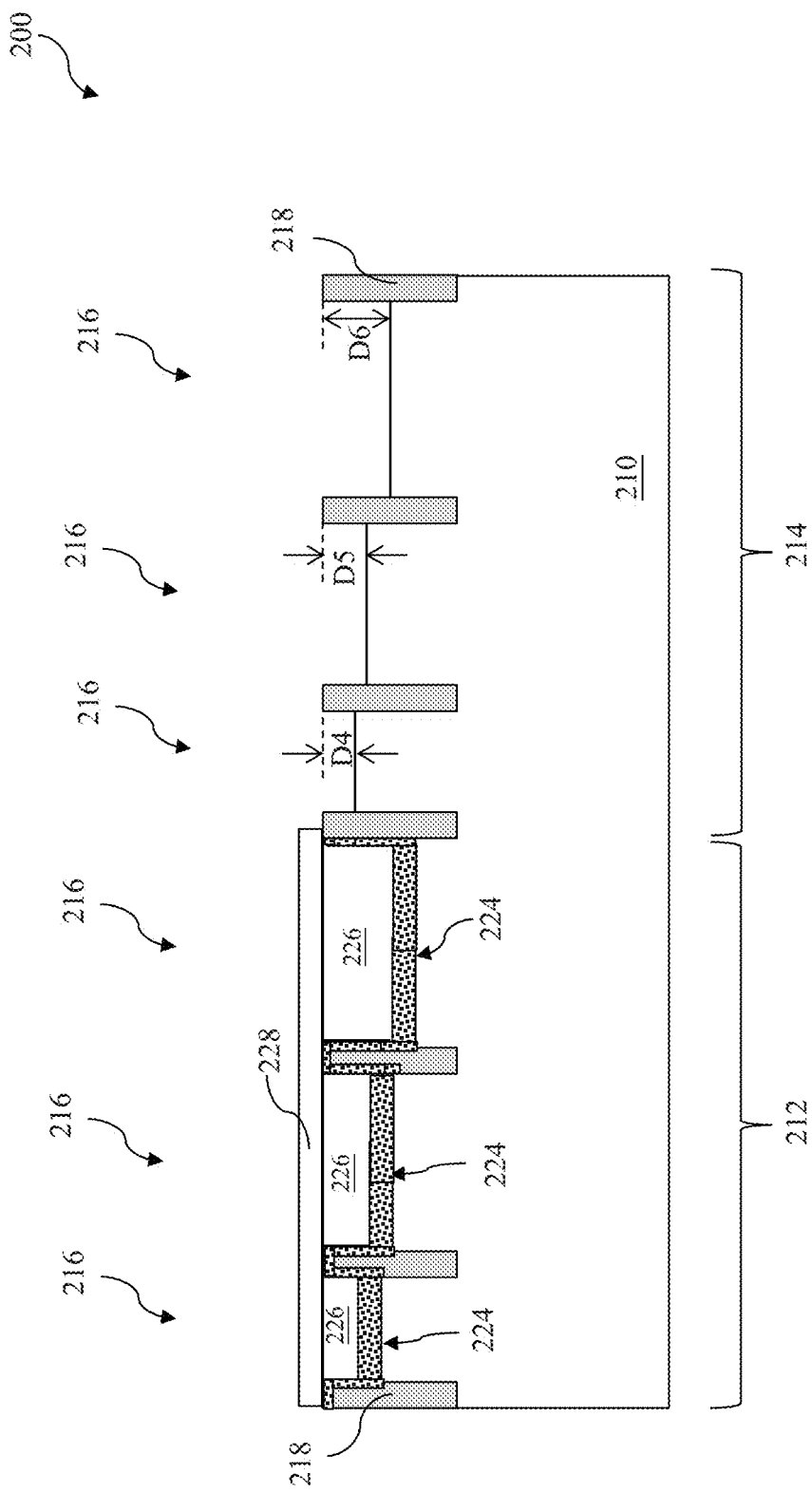

Referring to FIGS. 1 and 11, the method 100 includes an operation 118 to recess the fin features 216 within the second region 214 by etching. The etching process is designed to selectively remove the semiconductor material(s) in the fin active regions 216 while the STI features remain. The etching process may include dry etch, wet etch or a combination. The patterned mask 228 protects the fin features 216 within the first region 212 form etching. Due to the loading effect of the etching process, the fin features 216 that are larger will be etched more quickly than the smaller fin features 216. Specifically, because the three p-type features 216 have dimensions L4, L5 and L6, respectively, the corresponding recessed depths (D4, D5, and D6) are different. Particularly, D4 is less than D5 and D5 is less than D6. Thus, at later stage, anti-punch-through (APT) doping features are formed in the respective n-type fin features at different levels. The etching process is designed with a suitable etch duration and an etch rate such that the depths (D1, D2 and D3) are within the desired ranges.

Figure 12:
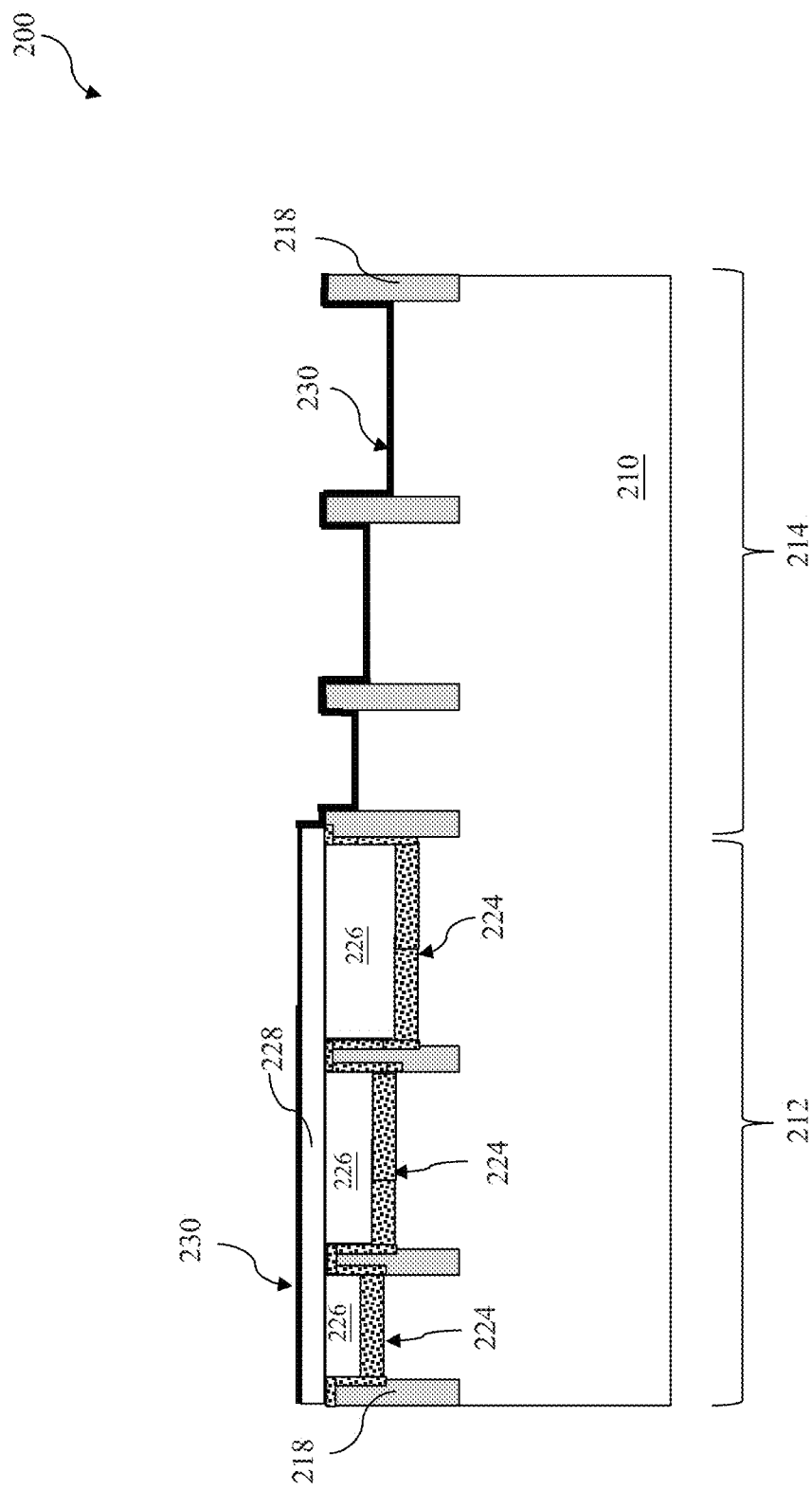

Referring to FIGS. 1 and 12, the method 100 proceeds to operation 120 by forming a second dopant-containing dielectric material layer 230 having a second-type dopant, which is opposite to the first-type dopant in conductivity. In the present embodiment, the second type dopant is an n-type dopant. Particularly, the second dopant-containing dielectric material layer 230 is formed in the recessed fin features and the sidewalls of the STI features 218 within the second region 214. In some embodiments, the operation 120 includes depositing a phosphosilicate glass (phosphorous-doped-glass or PSG) layer 230 containing n-type dopant. The PSG layer 230 functions as a solid source for the n-type dopant to be introduced to the p-type fin features 216 within the second region 214. The concentration of the n-type dopant in the PSG layer 230 is designed such that to introduce the p-type dopant with a proper doping concentration during one or more subsequent thermal process. In some embodiments, the dopant concentration of the PSG layer 230 ranges from about 1021/cm3 to about 8×1021/cm3. The PSG layer 230 is formed by a suitable technique, such as CVD with suitable precursor. In some examples, the precursor to form the PSG layer 230 by CVD includes SiH4, O2, and PH3.

In some embodiments, the operation 120 further includes depositing an USG layer on the PSG layer 228 and depositing a silicon nitride layer 232 on the USG layer. In this case, the USG layer and the PSG layer are collectively referred to by the numeral 230. The USG layer is a capping layer to protect the PSG layer. The USG layer may be formed by suitable technology, such as CVD. In some examples, the PSG layer has a thickness ranging between 0.5 nm and 2 nm; and the USG layer has a thickness ranging between of 1 nm and 4 nm.

Figure 13:
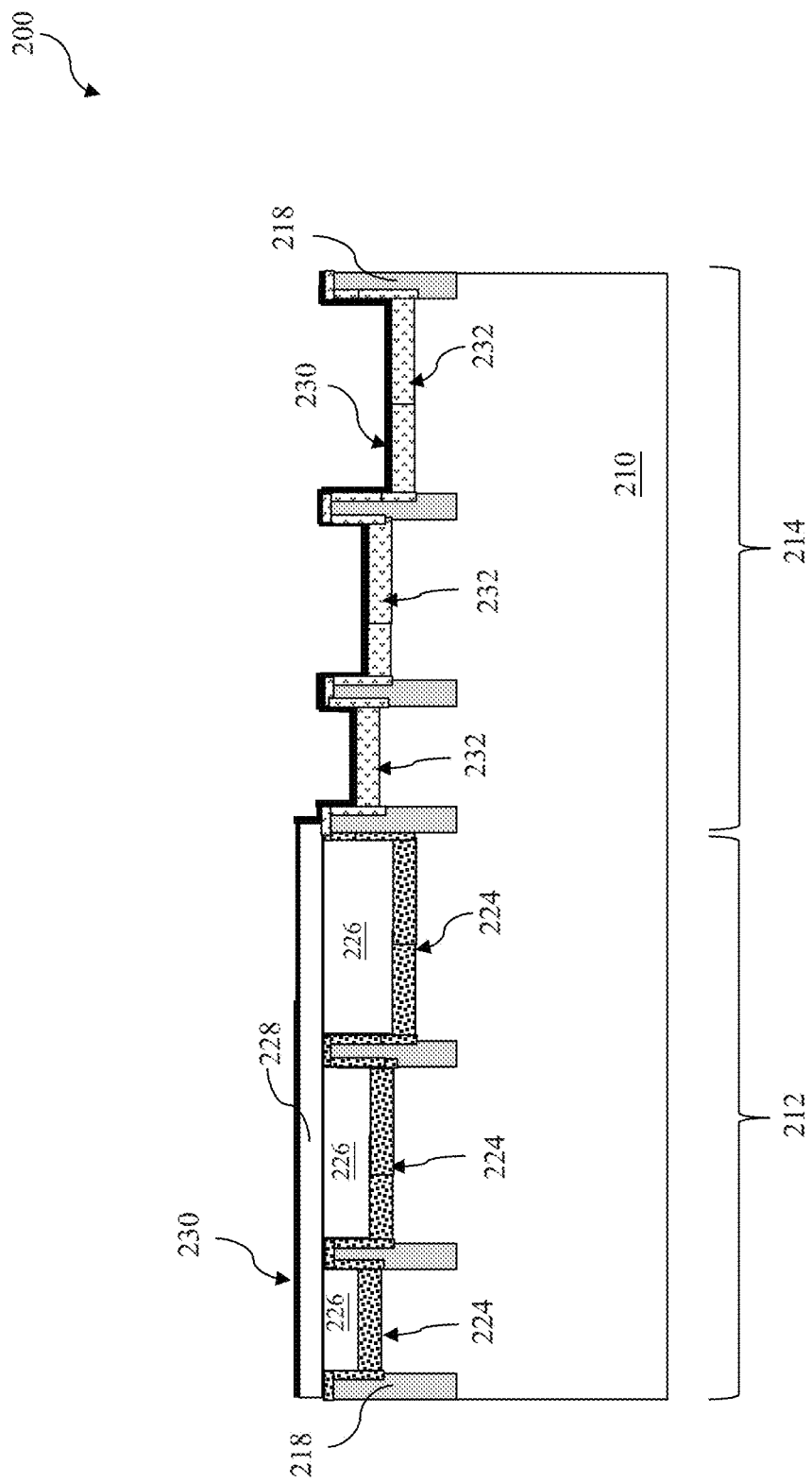

Referring to FIGS. 1 and 13, the method 100 proceeds to operation 122 to drive the second dopant from the PSG layer to the recessed fin features (that are the p-type fin features 216 within the second region 214), thereby forming APT features 224 of n-type conductivity (also referred to as n-type APT features) in the recessed fin features. The operation 122 may include one or more thermal process to drive the dopant from the PSG layer to the recessed fin features. The thermal process is designed with proper annealing temperature and annealing duration. In some examples, the thermal annealing process may be implemented in a rapid thermal annealing apparatus. Thus formed n-type APT features 232 are positioned at different levels but with a same thickness, which is determined by the dopant concentration of the PSG layer and the thermal annealing process (including annealing temperature and annealing duration). In some examples, the n-type APT features 232 are formed to have a thickness within a range of about 5-10 nanometers. In one example, the concentration of the n-type dopant for the APT features 232 is within a range of about 1×1017/cm3-1×1018/cm3. The dopant concentration of the APT features 232 is greater than that of the channel layer that is to be formed at later stage, as described below. The n-type APT features 232 are not formed in the first region 212 since the hard mask 228 prevents the diffusion of the dopant from the PSG layer to the fin features in the first region 212.

Additionally, the dopant is also driven into the STI features 218, such as into surfaces of the STI features 218 in the second region 214. The doped surfaces of the STI features extend from the fin features 216 to the top surfaces of the STI features 218 within the second region 214, as illustrated in FIG. 13. The STI features with doped surfaces help enhance device performance, such as eliminating the leakage by junction isolation effect, and reducing faucet issue associated with epitaxy growth.

Figure 14:
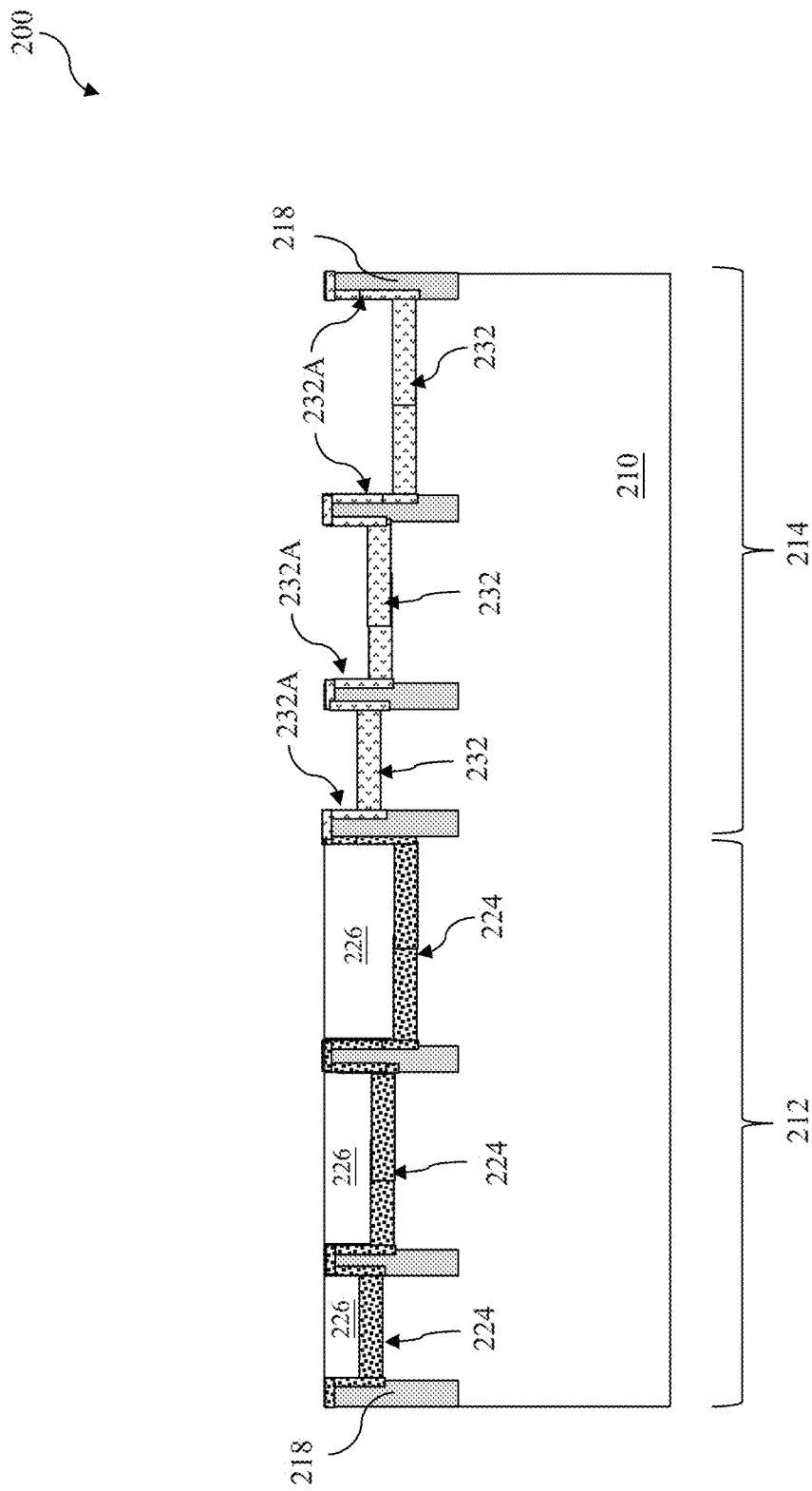

Referring to FIGS. 1 and 14, the method 100 proceeds to operation 124 to remove the second dopant-containing dielectric material layer 230, which is the PSG layer in the present embodiment. In some embodiments, the USG layer is removed as well when it is present. The removal of the second dopant-containing dielectric material layer is by a suitable etching process. For example, the PSG layer (and the USG layer) is removed by a wet etch using DHF solution. In the operation 124, the hard mask 228 is removed as well according to the present embodiment. For example, the hard mask 228 of silicon nitride may be removed by a wet etch using (hot) phosphorous acid.

Particularly, the doped surfaces, labeled as 232A in FIG. 14, of the STI features 218 within the second region 214 have different heights in different regions, such as short channel region and long channel region. The doped surfaces 232A are n-type doped.

Figure 15:
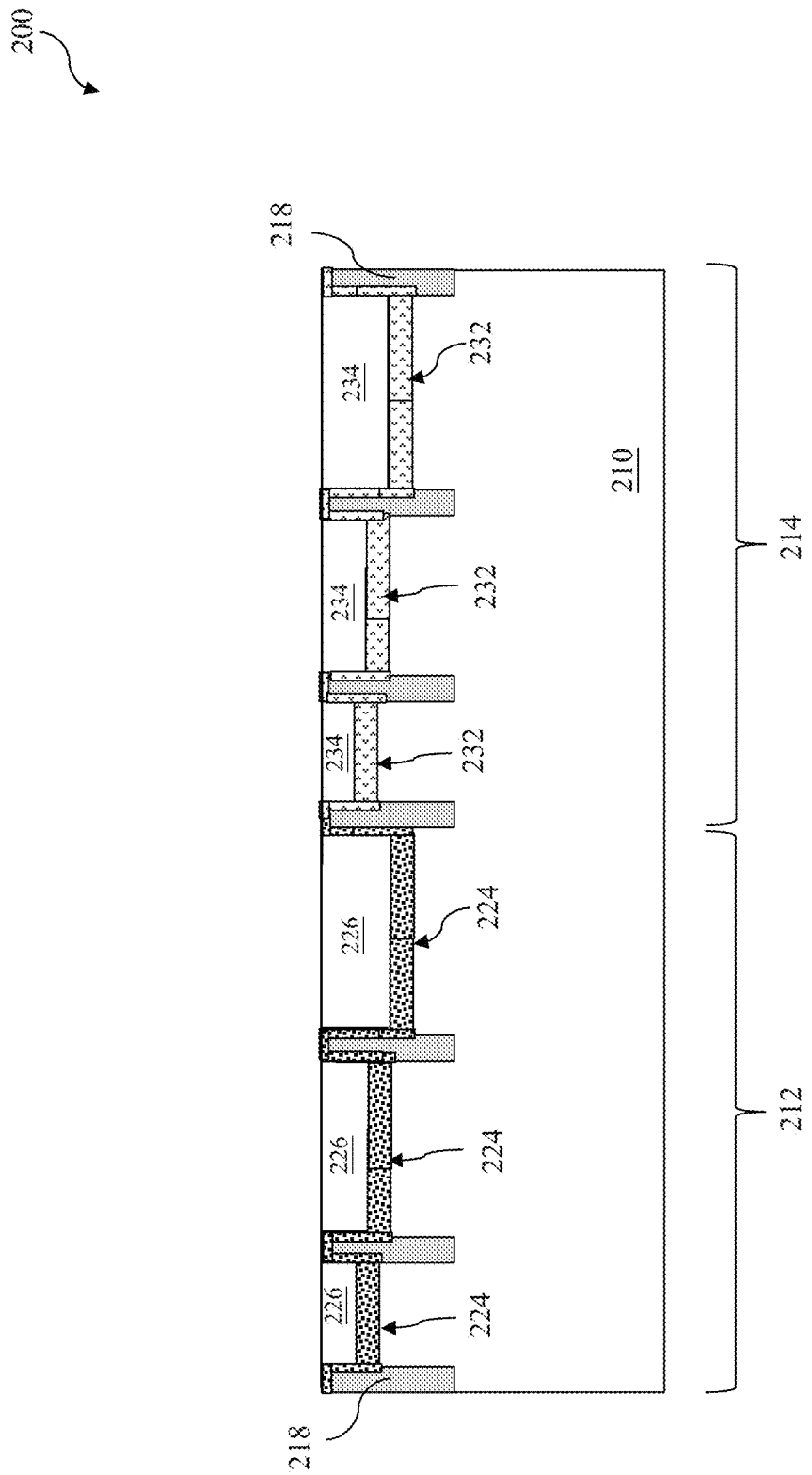

Referring to FIGS. 1 and 15, the method 100 proceeds to operation 126 to form channel material layer 234 in the trenches within the second region 212. The channel material layer 234 includes a semiconductor material epitaxially grown in the trenches and doped with n-type dopant, such as phosphorous. Since the APT features 232 are at different levels, the channel material layer may have different heights on different fin features and therefore an uneven profile. A polish, such as CMP, may be applied to the channel material layer 234 to planarize the top surface. In this case, the hard mask 228 may serve as a polish stop layer during the polish and be removed by polishing or by etching thereafter. As the channel material layer 234 has a planarized surface, the channel material layer 234 on the different fin features has different thicknesses, as illustrated in FIG. 15. Furthermore, the In some embodiments, the semiconductor material in the channel material layer 234 is different from that of the substrate 210 for various considerations, such as strain effect for high mobility or using a semiconductor material of high mobility. In various examples, the channel material layer 226 includes silicon, silicon germanium, germanium, silicon germanium tin (SiGeSn), germanium tin (GeSn), or a compound semiconductor material from III-V groups. In exemplary embodiments, the compound semiconductor material from III-V groups includes Gallium arsenide, Gallium arsenide phosphide, Gallium nitride, Gallium phosphide, Indium arsenide, Indium gallium arsenide, Indium gallium nitride, Indium gallium phosphide, Indium nitride, Indium phosphide, Aluminium arsenide, Aluminium gallium arsenide, Aluminium gallium indium phosphide, Aluminium gallium nitride, Aluminium gallium phosphide, Aluminium indium arsenide, Aluminium nitride, Aluminium phosphide, or a combination thereof. In further examples, the channel material layer 226 may include two or more semiconductor material films.

In some embodiments, the channel material layer 234 includes a semiconductor material different from that of the channel material layer 226 within the first region 212. For examples, the first channel material layer 226 in the first region 212 for n-type transistors includes a first semiconductor material that has a relative higher electron mobility while the second channel material layer 234 in the second region 214 for p-type transistors includes a second semiconductor material that has a relative higher hole mobility. In furtherance of the examples, the first channel material layer 226 in the first region 212 for n-type transistors includes gallium arsenic or indium phosphorous while the second channel material layer 234 in the second region 214 for p-type transistors includes germanium or diamond.

Figure 16:
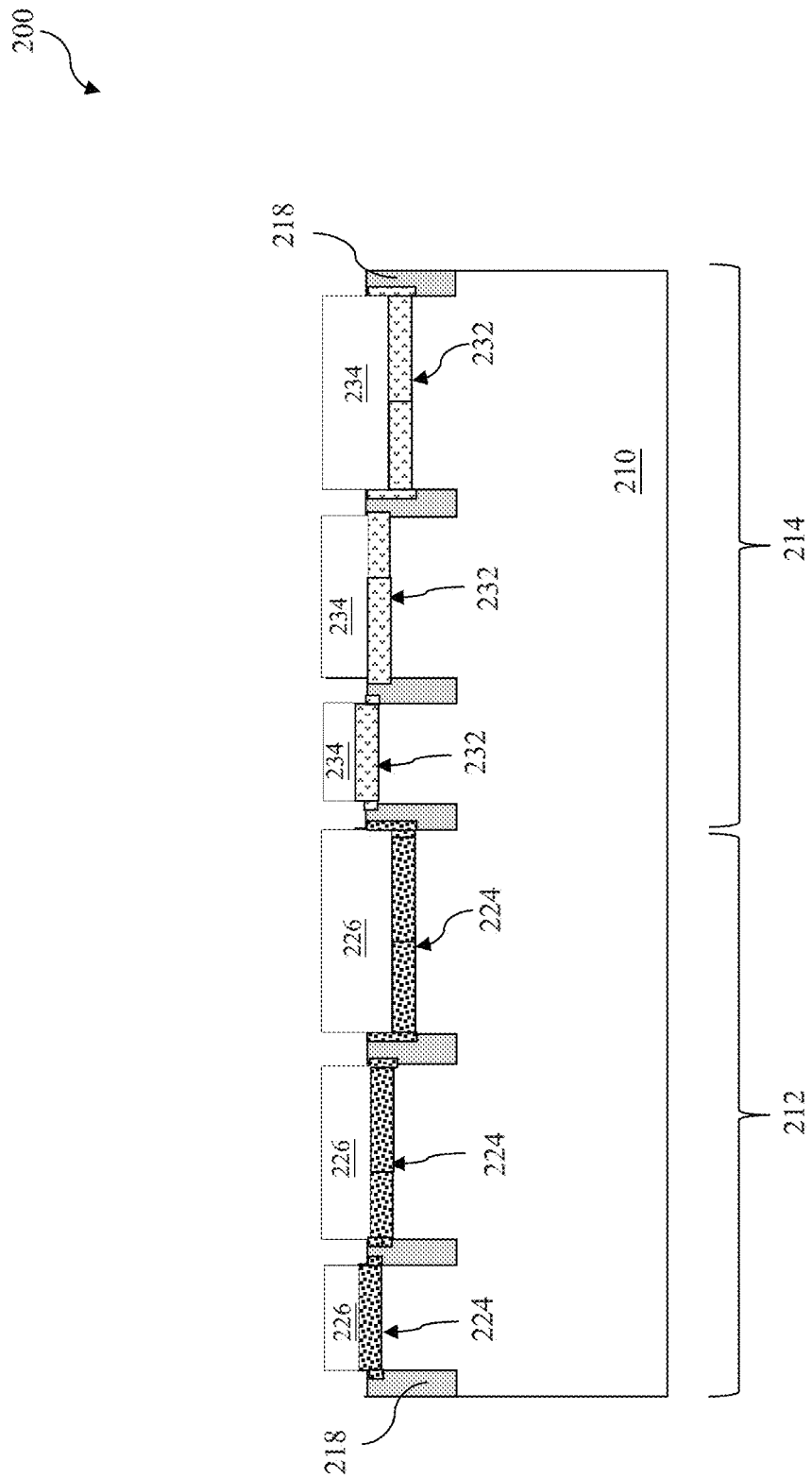

Referring to FIGS. 1 and 16, the method 100 proceeds to operation 128 to recess the STI features 218. The operation 128 may include one or more etching process to selectively etch back the STI features 218, thereby forming recessed STI features. For examples, the operation 128 includes wet etch, dry etch, or a combination thereof. In furtherance of the examples, the operation 128 includes a wet etching process using DHF solution as etchant. The fin features 216, especially the channel material layers 226 in the firsts region 212 and the channel material layer 234 in the second region 214 extend above the recessed STI features 218.

Figure 17:
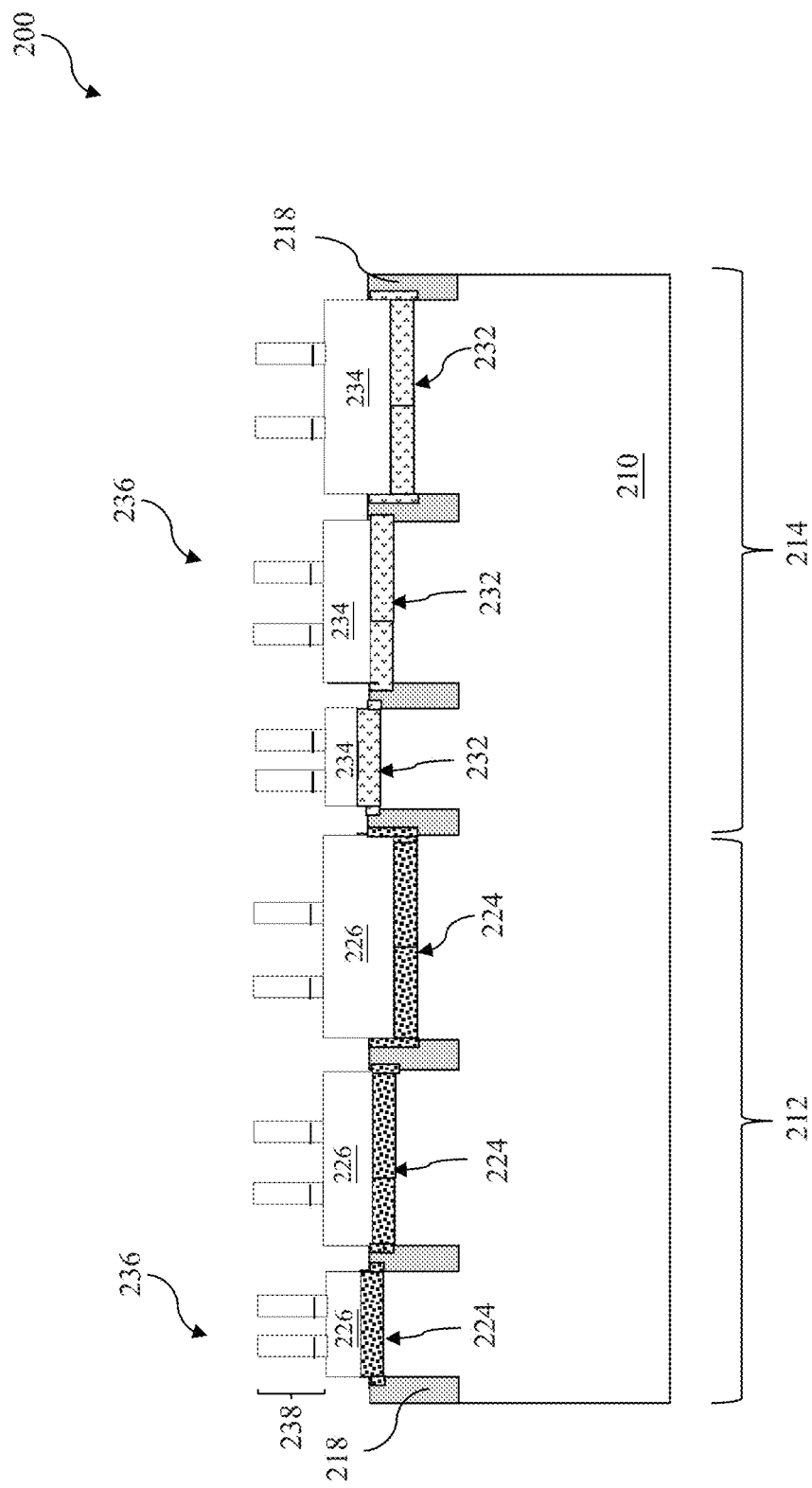
Figure 18:
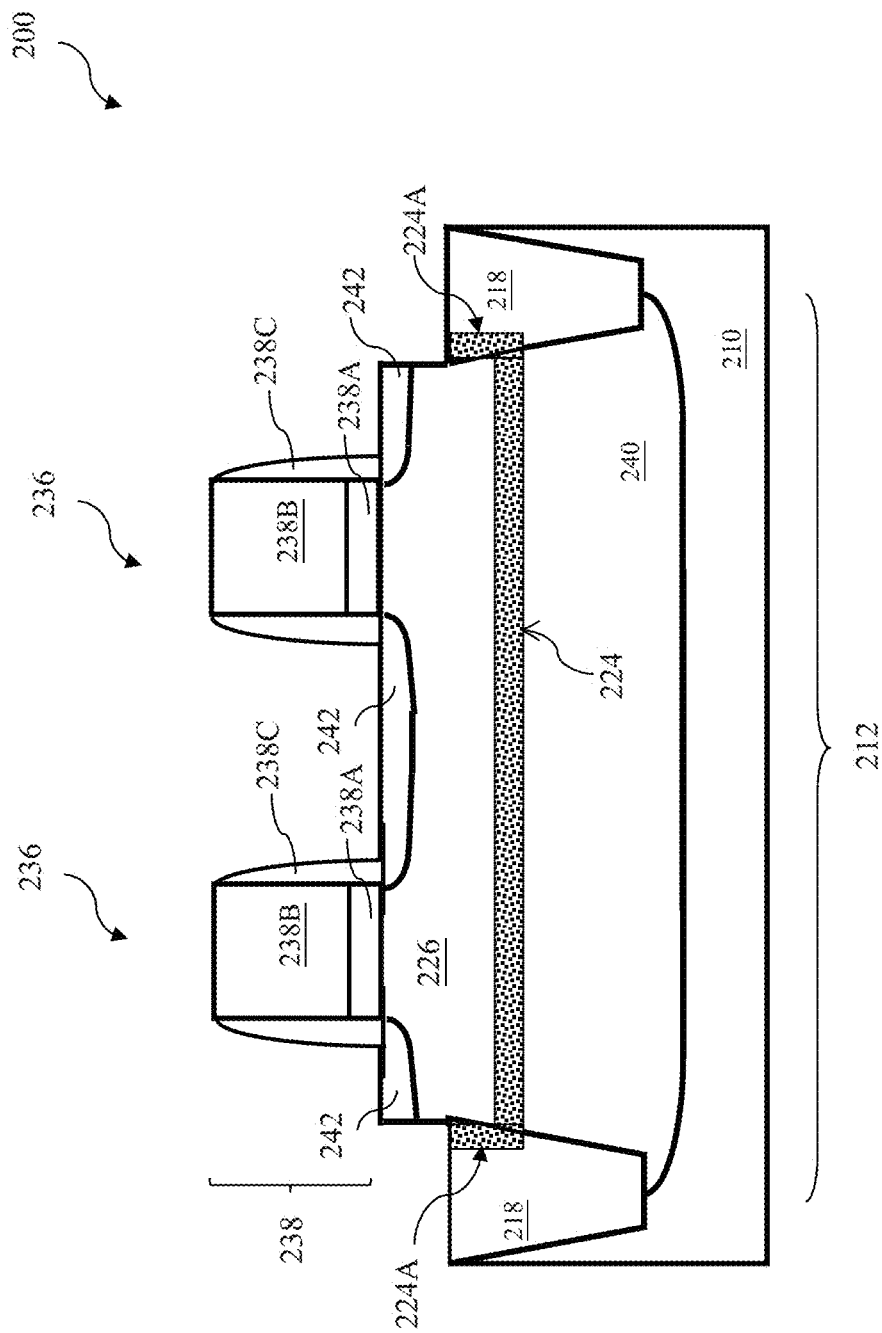
FIG. 18 is a sectional view of the semiconductor structure of FIG. 17 in portion, constructed in accordance with some embodiments.

Referring to FIGS. 1 and 17, the method 100 proceeds to operation 130 to form, on the fin features 216, various semiconductor devices, such as field effect transistors (FETs), dipole transistors, diodes, passive devices (resistors, inductors, capacitors or a combination thereof) or a combination thereof. In the present embodiment illustrated in FIG. 17, exemplary field effect transistors 236 are formed on the fin features 216, and therefore are referred to as fin FETs (FinFETs). Particularly, each FinFET 236 includes source and drain features, and a gate stack 238 interposed between the source and drain features. Particularly, n-type FinFETs are formed on the fin features 216 within the first region 212 and p-type FinFETs are formed on the fin features 216 within the second region 214. One or more FinFETs may be formed on each fin feature. The structure and formation of the FinFETs 236 are further described below.

In the semiconductor structure, the p-doped surfaces 224A and the n-doped surfaces 232A are portions of the STI features 218. The doped surfaces are configured surrounding the corresponding channel material layers. Specifically, the p-doped surfaces 224A are surrounding the channel material layer 226 in the first region 212; and the n-doped surfaces 232A are surrounding the channel material layer 234 in the second region 214. As noted above, the doped surfaces help enhance device performance, such as eliminating the leakage by junction isolation effect, and reducing faucet issue associated with epitaxy growth. Especially, doped surfaces have different heights. The doped surfaces vertically extended from the bottom of the corresponding APT features to the top of the STI features. Since the APT features are at different levels, therefore the doped surfaces have different heights.

FIG. 18 is a sectional view of the semiconductor structure 200 in portion, constructed in accordance with some embodiments. In FIG. 18, the active region is designed to form a FET, such as a p-type FET (pFET) or an n-type FET (nFET). In some embodiments, a doped well 240 may be formed in the substrate, such as after the formation the STI features 218 and prior to the formation of the APT features. In the present example, only one exemplary fin feature 216 and the corresponding FinFETs 236 in the first region 212 are illustrated In FIG. 18. The descriptions are applied to the first region 212 and the corresponding features. However, the portion of the semiconductor structure 200 in the second region 214 is similar but with opposite type of conductive.

The semiconductor structure 100 includes a semiconductor substrate 110. In some examples, the doped well 240 is a p-type well and includes a p-type dopant, such as boron (B), distributed in an active region where nFET(s) is to be formed. The dopant may be introduced to the p-well 240 through an opening of the mask layer by a suitable doping process, such as one or more ion implantation. In one example, the doped well 240 may have a corresponding doping concentration ranging between about 1016 and 1018 cm-3. In another example, the doped well 240 may have a depth ranging between about 0.5 micrometers and 2 micrometers. The APT features 224 and the channel material layer 226 are formed in the fin feature. The channel material layer 226 serves as a conductive path when the corresponding FinFET(s) are turned on during operations.

Similarly, in the second region 214, an n-type well is formed and includes an-type dopant (such as phosphorous) distributed in an active region where pFET(s) are to be formed. The APT features 232 and the channel material layer 234 are formed in the fin feature within the second region 214.

Each FinFET 236 includes a gate stack 238 formed on channel material layer 226, and source and drain features 242 formed in the channel material layer. The gate stack 238 includes a gate dielectric feature 238A disposed on the channel material layer 226 and a gate electrode 238B disposed on the gate dielectric feature 238A. The gate stack 238 may further include gate spacers 238C disposed on sidewalls of the gate electrode 238A.

The gate dielectric feature 238A includes a gate dielectric material, such as silicon oxide or a suitable dielectric material having a higher dielectric constant (high-k dielectric material). In the present embodiment, the gate dielectric feature 238A includes more than one dielectric material layers. For example, the gate dielectric feature 238A includes an interfacial dielectric layer, such as silicon oxide, and a high-k dielectric material layer on the interfacial layer.

The gate electrode 238B includes a conductive material layer, such as doped polysilicon, metal, metal alloy, metal silicide, or a combination thereof. In some embodiments, the gate electrode 238B includes more than one conductive material layers. For example, the gate electrode 238B includes a first conductive layer having a suitable work function on the gate dielectric feature 238A and a second conductive layer on the first conductive layer. In one example for the n-type FinFET, the first conductive layer includes titanium or titanium aluminum. In another example, the second conductive layer includes aluminum, tungsten, copper, doped polysilicon or a combination thereof.

Similarly, the gate stacks in the second region 214 also includes a gate dielectric layer and a gate electrode. The gate electrode in the second region 214 may have a similar structure as that of the gate stack in the first region 212. However, the conductive material(s) may be different. For examples, in the second region 214, the gate electrode includes a first conductive material layer (such as tantalum nitride or titanium nitride), and a second conductive material layer (such as aluminum, tungsten, copper, doped polysilicon or a combination thereof).

The gate stack 238 is formed by a procedure that includes various deposition processes and patterning. The formation of the gate stack 238 is further described in accordance with some embodiments. In one embodiment, an interfacial layer is formed on the semiconductor substrate (particularly, on the channel material layer 226. The interfacial layer may include silicon oxide formed by a proper technique, such as an atomic layer deposition (ALD), thermal oxidation or UV-Ozone Oxidation. The interfacial layer may have a thickness less than 10 angstrom. A high k dielectric material layer is formed on the interfacial layer. The high-k dielectric layer includes a dielectric material having the dielectric constant higher than that of thermal silicon oxide, about 3.9. The high k dielectric material layer is formed by a suitable process such as ALD or other suitable technique. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides. The interfacial layer and the high k dielectric material layer constitute the gate dielectric layer.

In some embodiments, the gate electrode 238B includes polysilicon. A polysilicon layer is formed on the gate dielectric layer by a proper technique, such as CVD. In one example, a capping layer may be further formed between the high k dielectric material layer and the polysilicon layer by a proper technique, such as PVD. The capping layer may include titanium nitride (TiN), tantalum nitride (TaN) or a combination thereof in some examples. The capping layer may serve one or more functions, such as diffusion barrier, etch stop, and/or protection.

After the depositions, the gate material layers are patterned to form the gate stack 238 (or a plurality of gate stacks). The patterning of the gate stack 238 includes a lithography process and etching. A lithography process forms a patterned resist layer. In one example, the lithography process includes resist coating, soft baking, exposing, post-exposure baking (PEB), developing, and hard baking. The gate stack material layers are thereafter patterned by etching using the patterned resist layer as an etching mask. The etching process may include one or more etching steps. For example, multiple etching steps with different etchants may be applied to etch respective gate stack material layers.

In other embodiments, the patterning of the gate stack material layers may alternatively use a hard mask as an etching mask. The hard mask may include silicon nitride, silicon orynitride, silicon oxide, other suitable material, or a combination thereof. A hard mask layer is deposited on the gate stack material layers. A patterned resist layer is formed on the hard mask layer by a lithography process. Then, the hard mask is etched through the opening of the patterned resist layer, thereby forming a patterned hard mask. The patterned resist layer may be removed thereafter using a suitable process, such as wet stripping or plasma ashing.

The gate spacers 238C include a dielectric material and may have one or more films. In some embodiments, the fate spacers 238C include silicon oxide, silicon nitride, silicon oxynitride, other suitable dielectric material, or a combination thereof. The gate spacers 238C are formed by deposition and anisotropic etch (such as dry etch).

In some embodiments, the source and drain features 242 may further include light-doped drain (LDD) features formed in the fin feature 216 by a suitable process, such as ion implantation. The LDD features have a doping type opposite to that of the doped well 240. For example for an nFET, the doped well 240 is p-type and the LDD features are n-type. In another example for a pFET, the doped well is n-type and the LDD features are p-type. The LDD features and the gate stack 238 may be formed in a collective procedure. For examples, the gate stack material layers are deposited and patterned to form the gate dielectric layer and gate electrode layer; the LDD features are formed by ion implantation using the dummy gate stack (and STI features) to constrain the LDD features; and then the spacers are formed. In other embodiments, the LDD features are optional and may be eliminated from the semiconductor structure 200.

In some alternative embodiments, the gate stack 238 may be formed by a gate replacement process. The gate replacement process include forming a dummy gate; forming source and drain features; removing the dummy gate; and thereafter forming a final gate that includes a gate dielectric layer of a high k dielectric material and a metal gate electrode. In various embodiments, the gate replacement process may be a high-k-last process, in which both the gate dielectric layer and the gate electrode in the dummy gate are removed and replaced by the final gate stack.

In some alternative embodiments, the source and drain features 242 have different semiconductor material for strained effect and may be formed by a procedure that includes recessing the source and drain regions by etching; and filling the recesses with a different semiconductor (different from the channel material) by epitaxial growth. In some embodiments, the semiconductor material is chosen for proper strained effect in the channel region such that the corresponding carrier mobility is increased. For example, the semiconductor material for the source and drain features includes silicon carbide or silicon germanium. In one example, the FinFET 236 in the first region 212 is an nFET, the semiconductor material is silicon carbide doped with phosphorous. In one example, the FinFET device in the second region 214 is a pFET, the semiconductor material is silicon germanium doped with boron. In some embodiments, two or more FinFETs 236 are formed on a same fin feature 216. In the present example illustrated in FIG. 18, two FinFETs 236 are formed on the same fin feature 216 and share and a common source.

Note that the doping type of the p-type doped well 240 is same to the doping type of the APT feature 224 but the doping concentration of the doped well 240 is less than the doping concentration of the APT feature 224. Furthermore, the doping type of the channel material layer 226 is same to the doping type of the APT feature 224 but the doping concentration of the channel material layer 226 is less than that of the doped well 240 and is much less than the doping concentration of the APT feature 224 in the present embodiment. Similarly, the doping type of the n-type doped well in the second region 214 is same to the doping type of the APT feature 232 but the doping concentration of the n-type doped well is less than the doping concentration of the APT feature 232. The doping type of the channel material layer 234 in the second region 214 is same to the doping type of the APT feature 232 but the doping concentration of the channel material layer 234 is less than that of the doped n-type well in the second region and is much less than the doping concentration of the APT feature 232 in the present embodiment.

The method 100 may include other alternatives or modifications. In some embodiments, the operations 104-114 to form the first APT features 224 in the first region 212 and the operations 116-126 to form the second APT features 232 in the second region 214 may have different sequences such that the second APT features 232 are formed before the formation of the first APT features 224. Particularly, and the operations 116-126 are implemented before the operations 104-114.

The method 100 further includes other operations before, during and/or after the operations described above. In some embodiments, those annealing processes to drive the dopants from the corresponding dopant-containing layer (as solid phase dopant source) may be designed with proper thermal profiles with effective diffusion and minimized thermal budget. Those formed APT features are capable of preventing the transistors from punch-through effect and also eliminating undesired impact of the dopants to the channels, thus the device performance being enhanced.

The source and drain features may be formed by one or more ion implantations. The following description using the NMOS transistors as an example, and the formation of the source and drain features of MMOS transistors is similar. In some embodiments, the source and drain features for NMOS transistors are formed by an ion implantation procedure that includes a first ion implantation to form LDD features and a second ion implantation to form S/D features. In other embodiments, the formation of the gate stacks and the formation of the source and drain features are integrated in a collective procedure. In furtherance of the embodiments, the gate stacks are deposited and patterned; the first ion implantation is applied to the fin active regions to form LDD features; gate spacers are formed on sidewalls of the gate stacks by a suitable process (such as dielectric deposition and dry etching); and the second ion implantation is applied to the fin active regions to form S/D features.

The method 100 further includes an operation to form an interlayer dielectric material (ILD) on the semiconductor structure 200. The ILD includes one or more dielectric materials, such as silicon oxide, a low k dielectric material or a combination thereof. In some embodiment, the formation of the ILD includes deposition and CMP.

The method 100 includes an operation to form a multilayer interconnection structure to couple various devices to form a functional circuit. The multilayer interconnection structure includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The present disclosure provides a semiconductor structure and a method making the same. The semiconductor structure includes FETs formed on fin active regions and a doping profile with enhanced device performance. Particularly, the method includes forming fin active regions (fin features) formed on a semiconductor substrate; recessing the fin active regions; forming APT features by solid diffusion; and forming a channel material layer by epitaxy growth.

The embodiments of the present disclosure offer advantages over existing art, though it is understood that other embodiments may offer different advantages, not all advantages are necessarily discussed herein, and that no particular advantage is required for all embodiments. By utilizing the disclosed method and structure, APT feature is formed on the bottom portion of the fin active region and is extended into the substrate. The carrier concentration of the APT feature is independently tuned to prevent the punch-through effect without degrading the carrier concentration of the channel region. Especially, the APT features and the corresponding channel material layer are formed of different semiconductor materials for various device benefits, in accordance of some embodiments. The APT features in the different fin active regions are formed on different levels with a further freedom to tune device performances according the design, device type and fin feature dimension. In some embodiments, the source and drain features are formed of a semiconductor material, which is different from that of the corresponding APT feature, different from that the corresponding channel material layer, or is different from both.

Thus, the present disclosure provides a semiconductor structure. The semiconductor structure includes a fin active region formed on a semiconductor substrate and spanning between a first sidewall of a first shallow trench isolation (STI) feature and a second sidewall of a second STI feature; an anti-punch through (APT) feature of a first type conductivity; and a channel material layer of the first type conductivity, disposed on the APT feature and having a second doping concentration less than the first doping concentration. The APT feature is formed on the fin active region, spans between the first sidewall and the second sidewall, and has a first doping concentration The present disclosure provides a semiconductor structure in accordance with some embodiments. The semiconductor structure includes a semiconductor substrate having a first surface and a second surface opposite from each other; a first fin feature and a second fin feature formed on the first surface of the semiconductor substrate; a first anti-punch through (APT) feature formed on the first fin feature and extending from the first STI feature to the second STI feature; and a second APT feature formed on the first fin feature and extending from the second STI feature to the third STI feature. The first fin feature spans a first width between a first and second shallow trench isolation (STI) features. The second fin feature spans a second width between the second STI feature and a third STI feature. The second width is greater than the first width. The first APT feature and the second APT feature are disposed with a first distance and a second distance from the second surface, respectively, and the second distance being less than the second distance.

The present disclosure provides a method for fabricating a semiconductor structure in accordance with some embodiments. The method includes forming fin features on a semiconductor substrate; recessing the fin features by selective etching; forming a solid material layer containing a dopant; driving the dopant from the solid material layer to the fin features, thereby forming anti-punch-through (APT) features on the fin features, respectively; removing the solid material layer; and forming a channel material layer on the APT features by epitaxy growth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising: a fin active region formed in a semiconductor substrate and spanning between a first sidewall of a first shallow trench isolation (STI) feature and a second sidewall of a second STI feature; an anti-punch through (APT) feature of a first type conductivity, wherein the APT feature is formed on the fin active region, spans between the first sidewall and the second sidewall, and has a first doping concentration; and a channel material layer of the first type conductivity, disposed on the APT feature and having a second doping concentration less than the first doping concentration; a plurality of fin features with respective horizontal dimensions different from each other; and a plurality of another APT features formed on the plurality fin features, respectively, wherein the plurality of another APT features are formed on the semiconductor substrate at respective vertical levels different from each other.

2. The semiconductor structure of claim 1, further comprising a doped well of the first type conductivity, wherein the doped well is formed in the semiconductor substrate, is underlying the APT feature, and has a third doping concentration greater than the second carrier concentration and less than the first carrier concentration.

3. The semiconductor structure of claim 2, wherein the APT feature and the doped well include a first semiconductor material; and the channel material layer includes a second semiconductor material different from the first semiconductor material.

4. The semiconductor structure of claim 1, wherein the first STI feature further includes a first doped surface region on the first sidewall, and the second STI feature further includes a second doped surface region on the second sidewall.

5. The semiconductor structure of claim 4, wherein the first doped surface region, the APT feature and the second doped surface region are aligned on a same level.

6. The semiconductor structure of claim 1, wherein the channel material layer is vertically extends above top surfaces of the first and second STI features.

7. The semiconductor structure of claim 1, further comprising a first field effect transistor (FET) formed on the fin active region, wherein the first FET includes
    a first gate stack disposed on the channel material layer; and
    a first source feature and a first drain feature formed in the channel material layer and interposed by the gate stack.

8. The semiconductor structure of claim 7, wherein the source and drain features includes a semiconductor material different from a second semiconductor material of the APT feature and a third semiconductor material of the channel material layer.

9. The semiconductor structure of claim 7, further comprising a second FET formed on the fin active region and being adjacent the first FET, wherein the second FET includes
    a second gate stack disposed on the channel material layer;
    a second drain feature formed in the channel material layer; and
    the first source shared with the first FET.

10. The semiconductor structure of claim 1, wherein the APT features have a same thickness and the channel material layer has a planar surface and different thicknesses on the APT features.

11. The semiconductor structure claim 1, further comprising a plurality of FETs formed on the plurality of fin features, respectively, wherein the plurality of FETs includes a short channel FET, a middle channel FET and a long channel FET.

12. A semiconductor structure comprising: a semiconductor substrate having a first surface and a second surface opposite from each other; a first fin feature and a second fin feature formed on the first surface of the semiconductor substrate, wherein the first fin feature spans a first width between a first and second shallow trench isolation (STI) features, and the second fin feature spans a second width between the second STI feature and a third STI feature, the second width being greater than the first width; a first anti-punch through (APT) feature formed on the first fin feature and extending from the first STI feature to the second STI feature; and a second APT feature formed on the first fin feature and extending from the second STI feature to the third STI feature, wherein the first APT feature and the second APT feature are disposed with a first distance and a second distance from the second surface, respectively, and the second distance being less than the second distance.

13. The semiconductor structure of claim 12, further comprising:
    a first channel material layer of a first thickness, disposed on the first APT feature; and a second channel material layer of a second thickness, disposed on the second APT feature, wherein the second thickness is greater than the first thickness.

14. The semiconductor structure of claim 13, wherein the first and second APT features have a same thickness.

15. A method, comprising: forming fin features on a semiconductor substrate; recessing the fin features by selective etching; forming a solid material layer containing a dopant; driving the dopant from the solid material layer to the fin features, thereby forming anti-punch-through (APT) features on the fin features, respectively; removing the solid material layer; and forming a channel material layer on the APT features by epitaxy growth.

16. The method of claim 15, wherein
the forming of the solid material layer includes forming the solid material layer on sidewalls of shallow trench isolation (STI) features; and
the driving the dopant from the solid material layer further includes driving the dopant from the solid material layer to the sidewalls of the STI features, thereby forming doped surface of the STI features.

17. The method of claim 15, wherein
the forming of fin features includes forming the fin features with different widths;
the recessing of the fin features includes etching back the fin features, thereby forming the recessed fin features to different depths; and
the APT features are formed on the recessed fin features are at different depths.

18. The method of claim 17, wherein
the forming of the solid diffusion layer includes forming one of a phosphosilicate glass (PSG) layer and a borosilicate glass (BSG) layer; and
the driving of the dopant from the solid material layer includes performing a thermal annealing process to diffuse the dopant to the recessed fin features and the sidewalls of the STI features.

19. The method of claim 15, further comprising:
forming a shallow trench isolation structure in the semiconductor substrate, and
recessing the shallow trench isolation structure after forming the channel material layer on the APT features by epitaxy growth.

20. The semiconductor structure of claim 1, wherein each one of the another APT features from the plurality of another APT features has the first type conductivity.

* * * * *